(12) United States Patent
Song et al.

(10) Patent No.: US 12,477,713 B2
(45) Date of Patent: Nov. 18, 2025

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Seung Min Song, Suwon-si (KR); Hyo-Jin Kim, Suwon-si (KR); Kyung Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 434 days.

(21) Appl. No.: 18/076,963

(22) Filed: Dec. 7, 2022

(65) Prior Publication Data

US 2023/0389257 A1 Nov. 30, 2023

(30) Foreign Application Priority Data

May 27, 2022 (KR) .......................... 10-2022-0065510

(51) Int. Cl.
 *H10B 10/00* (2023.01)
(52) U.S. Cl.
 CPC .................................. *H10B 10/125* (2023.02)
(58) Field of Classification Search
 None
 See application file for complete search history.

(56) References Cited

U.S. PATENT DOCUMENTS

| | | | |
|---|---|---|---|
| 10,879,308 B1 | 12/2020 | Ando et al. | |
| 10,943,923 B2 | 3/2021 | Jeong et al. | |
| 11,063,045 B2 | 7/2021 | Wu et al. | |
| 11,195,937 B2 | 12/2021 | Liaw | |
| 2019/0148384 A1* | 5/2019 | Bae | H10D 84/85 257/330 |
| 2020/0127054 A1* | 4/2020 | Ando | H10N 70/021 |
| 2021/0028160 A1* | 1/2021 | Lee | H01L 23/5286 |

* cited by examiner

*Primary Examiner* — Khaja Ahmad
(74) *Attorney, Agent, or Firm* — Sughrue Mion, PLLC

(57) ABSTRACT

A semiconductor device includes a substrate, a lower active pattern which is spaced apart from the substrate and extends in a first direction, an upper active pattern on the lower active pattern, the upper active pattern being spaced apart from the lower active pattern and extending in the first direction, a gate structure on the substrate, the gate structure extending in a second direction intersecting the first direction, and a cutting pattern on the substrate, the cutting pattern extending in the first direction to cut the gate structure. The gate structure includes a lower gate electrode through which the lower active pattern penetrates, an upper gate electrode which is connected to the lower gate electrode and through which the upper active pattern penetrates, and an insulating pattern on one side of the cutting pattern, the insulating pattern being arranged with the upper gate electrode along the second direction.

20 Claims, 37 Drawing Sheets

SEMICONDUCTOR DEVICE AND METHOD FOR FABRICATING THE SAME

CROSS-REFERENCE TO RELATED APPLICATION

This application is based on and claims priority from Korean Patent Application No. 10-2022-0065510 filed on May 27, 2022 in the Korean Intellectual Property Office, the contents of which being herein incorporated by reference in its entirety.

BACKGROUND

The present disclosure relates to a semiconductor device and a method for fabricating the same and, more specifically, to a semiconductor device including a multi-bridge channel, and a method for fabricating the same.

As one of scaling technologies for increasing density of an integrated circuit device, a multi-gate transistor in which a silicon body having a fin or nanowire shape is formed on a substrate and a gate is formed on a surface of the silicon body has been proposed.

Since such a multi gate transistor utilizes a three-dimensional channel, scaling is easily performed. Further, even if a gate length of the multi gate transistor is not increased, the current control capability may be improved. Furthermore, a short channel effect (SCE) in which the potential of a channel region is influenced by a drain voltage may be effectively suppressed.

SUMMARY

It is an aspect to provide a semiconductor device having improved design flexibility and degree of integration.

It is another aspect to provide a method for fabricating a semiconductor device having improved design flexibility and degree of integration.

According to an aspect of one or more embodiments, there is provided a semiconductor device including a substrate, a lower active pattern which is spaced apart from the substrate and extends in a first direction, an upper active pattern on the lower active pattern, the upper active pattern being spaced apart from the lower active pattern and extending in the first direction, a gate structure on the substrate, the gate structure extending in a second direction intersecting the first direction, and a cutting pattern on the substrate, the cutting pattern extending in the first direction to cut the gate structure. The gate structure includes a lower gate electrode through which the lower active pattern penetrates, an upper gate electrode which is connected to the lower gate electrode and through which the upper active pattern penetrates, and an insulating pattern on one side of the cutting pattern, the insulating pattern being arranged with the upper gate electrode along the second direction.

According to another aspect of one or more embodiments, there is provided a semiconductor device comprising a substrate; a cutting pattern on the substrate, the cutting pattern extending in a first direction; a first lower gate electrode which extends from a first side of the cutting pattern in a second direction intersecting the first direction; a second lower gate electrode which extends in the second direction from a second side of the cutting pattern that is opposite to the first side, the second lower gate electrode being arranged with the first lower gate electrode along the second direction; a first upper gate electrode on the first lower gate electrode, the first upper gate electrode extending in the second direction and being connected to the first lower gate electrode; an insulating pattern on the second lower gate electrode, the insulating pattern being arranged with the first upper gate electrode along the second direction; a first lower active pattern extending in the first direction and penetrating the first lower gate electrode; a second lower active pattern extending in the first direction and penetrating the second lower gate electrode; a first upper active pattern extending in the first direction and penetrating the first upper gate electrode; an overlap contact connected to the first upper gate electrode; and a gate contact connected to the second lower gate electrode. The insulating pattern electrically insulates the overlap contact and the gate contact.

According to yet another aspect of one or more embodiments, there is provided semiconductor device comprising a substrate; a cutting pattern on the substrate, the cutting pattern extending in a first direction; a first lower gate electrode which extends from a first side of the cutting pattern in a second direction intersecting the first direction; a second lower gate electrode which extends from a second side of the cutting pattern opposite to the first side of the cutting pattern in the second direction, the second lower gate electrode being arranged with the first lower gate electrode along the second direction; a first upper gate electrode on the first lower gate electrode, the first upper gate electrode extending in the second direction and being connected to the first lower gate electrode; an insulating pattern on the second lower gate electrode, the insulating pattern being arranged with the first upper gate electrode along the second direction; a third lower gate electrode which is spaced apart from the second lower gate electrode in the first direction and extends in the second direction; a third upper gate electrode on the third lower gate electrode, the third upper gate electrode extending in the second direction and being connected to the third lower gate electrode; a first lower active pattern extending in the first direction and penetrating the first lower gate electrode; a first upper active pattern extending in the first direction and penetrating the first upper gate electrode; a second lower active pattern extending in the first direction and penetrating the third lower gate electrode; a second upper active pattern extending in the first direction and penetrating the third upper gate electrode; a shared source/drain contact which connects a lower source/drain region of the second lower active pattern and an upper source/drain region of the second upper active pattern; and an overlap contact which connects the first upper gate electrode and the shared source/drain contact.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

In the present specification, although the terms such as "first" and "second" are used to describe various elements or components, it goes without saying that these elements or components are not limited by these terms. These terms are only used to distinguish a single element or component from other elements or components. Therefore, it goes without saying that a "first" element or component referred to below may be a "second" element or component within the scope of the present specification.

A semiconductor device according to exemplary embodiments will be described below with reference to FIGS. 1 to 23. Although the embodiments below mainly describe a static random access memory (SRAM) element as a semiconductor device, this is merely exemplary. Those who have ordinary knowledge in the technical field to which the present disclosure pertains will understand that the technical idea of the present disclosure may be applied to not only an SRAM element but also other various semiconductor devices such as a logic element.

Figure 1:
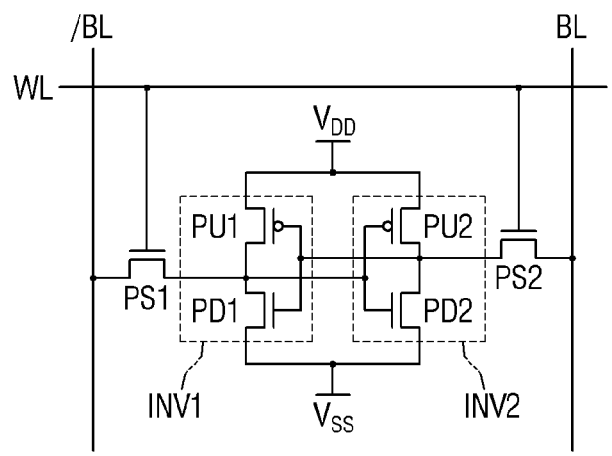
FIG. 1 is an exemplary circuit diagram for explaining a semiconductor device according to some embodiments.
Figure 2:
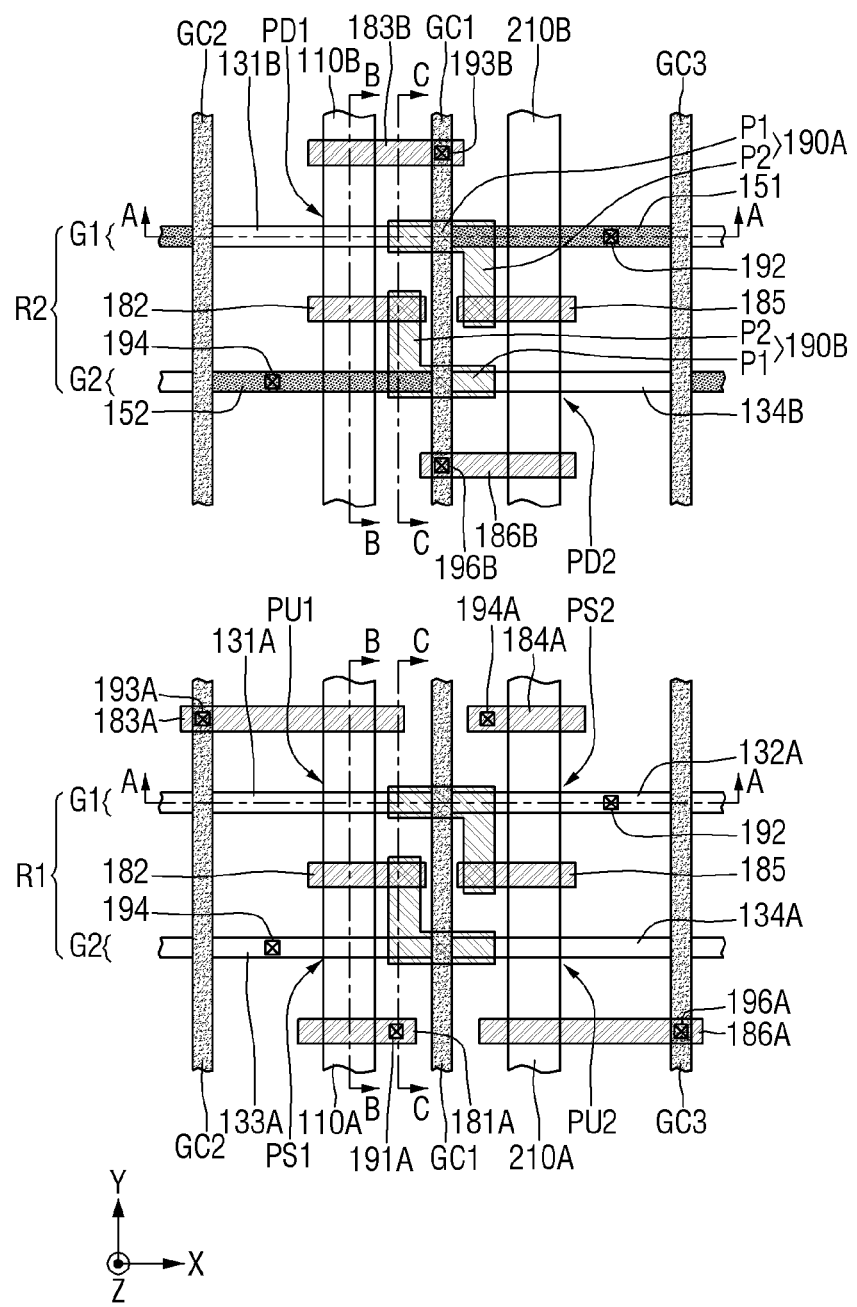
FIG. 2 is an exemplary layout diagram for explaining the semiconductor device according to some embodiments.
Figure 3:
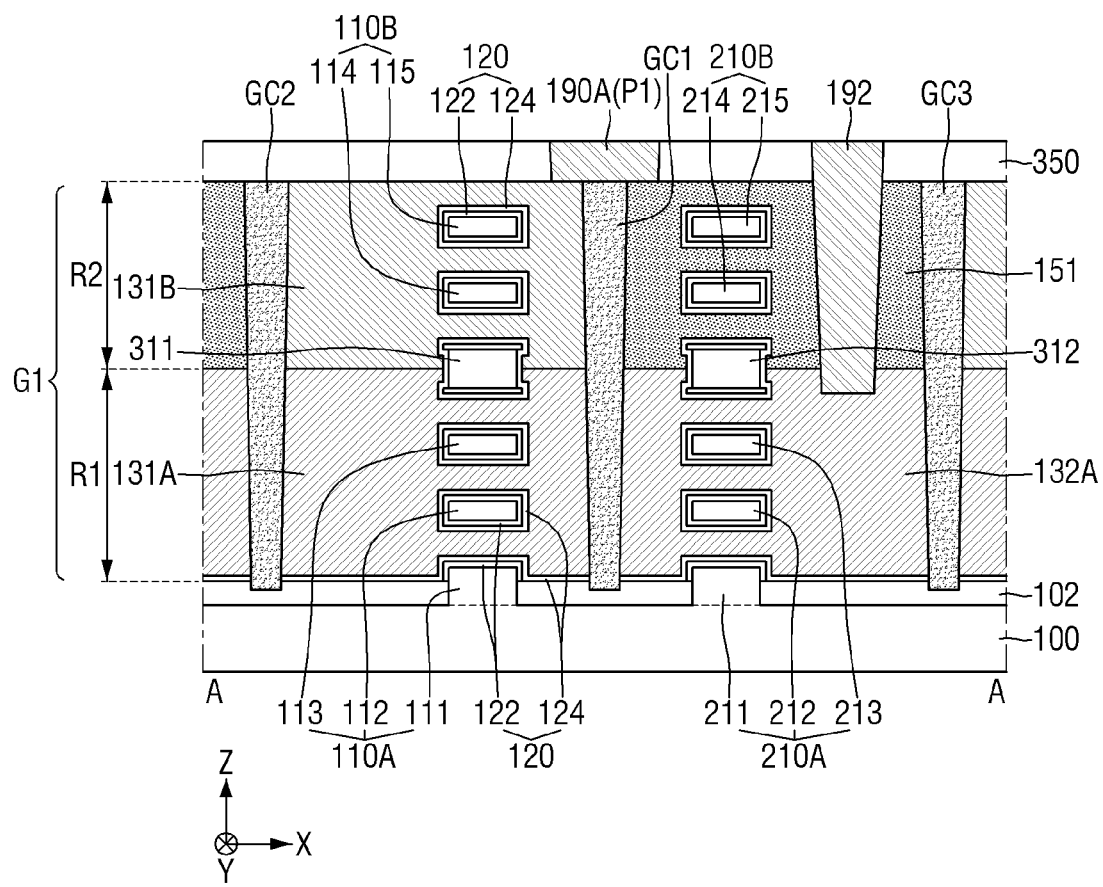
FIG. 3 is a schematic cross-sectional view taken along line A-A of FIG. 2.
Figure 4:
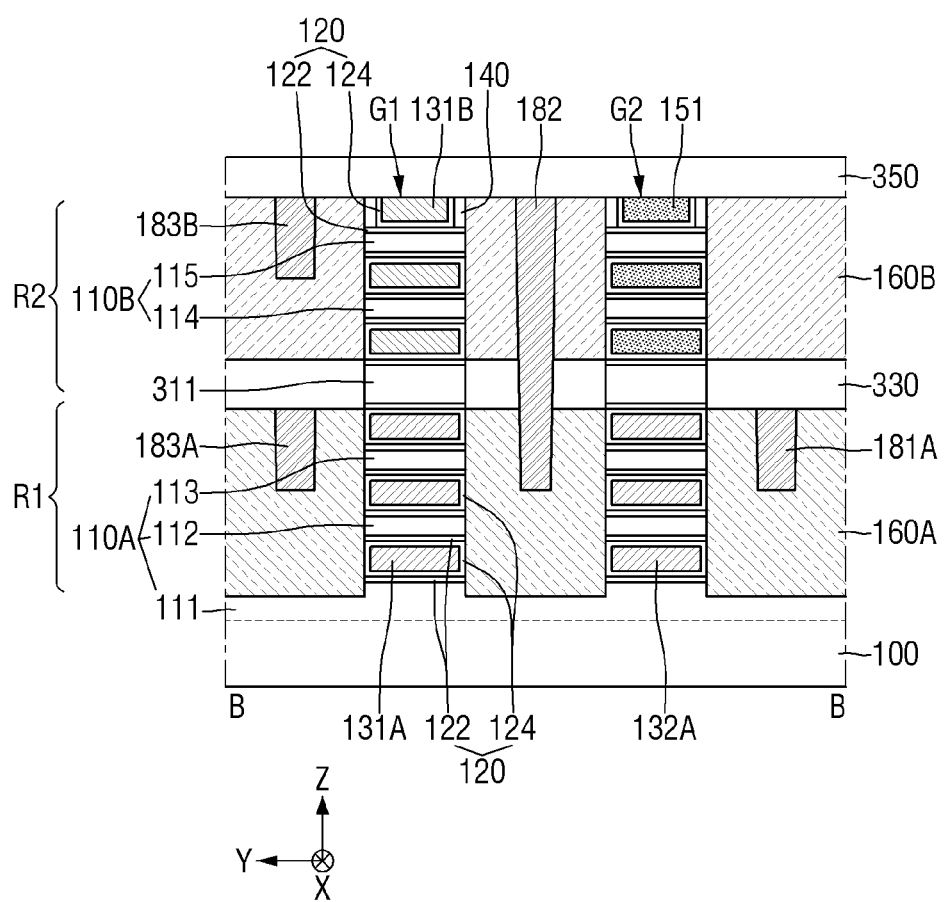
FIG. 4 is a schematic cross-sectional view taken along B-B of FIG. 2.
Figure 5:
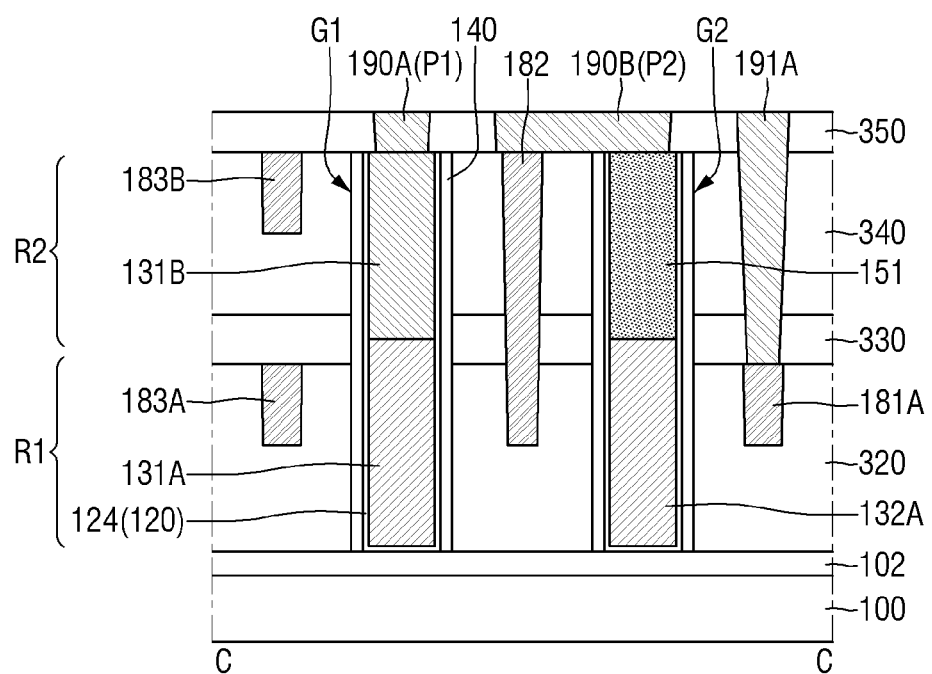
FIG. 5 is a schematic cross-sectional view taken along C-C of FIG. 2.
Figure 5:
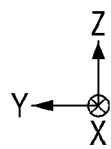

FIG. 1 is an exemplary circuit diagram for explaining a semiconductor device according to some embodiments. FIG. 2 is an exemplary layout diagram for explaining the semiconductor device according to some embodiments. FIG. 3 is a schematic cross-sectional view taken along line A-A of FIG. 2. FIG. 4 is a schematic cross-sectional view taken along B-B of FIG. 2. FIG. 5 is a schematic cross-sectional view taken along C-C of FIG. 2.

Referring to FIG. 1, the semiconductor device according to some embodiments includes a pair of inverters INV1 and INV2 connected in parallel between a power supply node $V_{DD}$ and a ground node $V_{SS}$, and a first pass transistor PS1 and a second pass transistor PS2 connected to output nodes of each of the inverters INV1 and INV2.

The first pass transistor PS1 may be connected to a bit line BL, and the second pass transistor PS2 may be connected to a complementary bit line /BL. Gates of the first pass transistor PS1 and the second pass transistor PS2 may be connected to a word line WL.

To configure a single latch circuit, an input node of the first inverter INV1 is connected to an output node of the second inverter INV2, and an input node of the second inverter INV2 is connected to an output node of the first inverter INV1.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be a PFET, and the first pull-down transistor PD1 and the second pull-down transistor PD2 may be an NFET.

Referring to FIGS. 2 to 5, a semiconductor device according to some embodiments includes a substrate 100, a field insulating film 102, first active patterns 110A and 110B, second active patterns 210A and 210B, a first gate structure G1, a second gate structure G2, a lower source/drain region 160A, an upper source/drain region 160B, first to third cutting patterns GC1, GC2 and GC3, first to fourth interlayer insulating films 320, 330, 340 and 350, first to fourth lower source/drain contacts 181A, 183A, 184A and 186A, first and second upper source/drain contacts 183B and 186B, first and second shared source/drain contacts 182 and 185, a first overlap contact 190A, a second overlap contact 190B, a first gate contact 192, and a second gate contact 194.

The substrate 100 may be bulk silicon or silicon-on-insulator (SOI). In some embodiments, the substrate 100 may be a silicon substrate, or may include other materials, for example, silicon germanium, SGOI (silicon germanium on insulator), indium antimonide, lead tellurium compounds, indium arsenic, indium phosphide, gallium arsenide or gallium antimonide. In some embodiments, the substrate 100 may be an epitaxial layer formed on a base substrate. For convenience of explanation and conciseness, the substrate 100 will be described below as a silicon substrate.

The first active patterns 110A and 110B and the second active patterns 210A and 210B may extend side by side in a first direction Y. That is, the first active patterns 110A and 110B and the second active patterns 210A and 210B may extend long in the first direction Y, and may be arranged along a second direction X intersecting the first direction Y.

The first active patterns 110A and 110B may include a first lower active pattern 110A and a first upper active pattern 110B that are sequentially stacked on the substrate 100 and spaced apart from each other. The first lower active pattern 110A may be spaced apart from the substrate 100, and the first upper active pattern 110B may be spaced apart from the first lower active pattern 110A. For example, the substrate 100, the first lower active pattern 110A and the first upper active pattern 110B may be sequentially arranged along a third direction Z intersecting the first direction Y and the second direction X.

In some embodiments, the first lower active pattern 110A may include a plurality of sheet patterns (e.g., a first sheet pattern 112 and a second sheet pattern 113) sequentially stacked on the substrate 100 and spaced apart from each other. In some embodiments, the first upper active pattern 110B may include a plurality of sheet patterns (e.g., a third sheet pattern 114 and a fourth sheet pattern 115) sequentially stacked on the first lower active pattern 110A and spaced apart from each other.

In some embodiments, a first fin-shaped pattern 111 may be formed between the substrate 100 and the first lower active pattern 110A. The first fin-shaped pattern 111 protrudes from the upper side of the substrate 100 and extends in the first direction Y. The first fin-shaped pattern 111 may be formed by etching a part of the substrate 100 or may be an epitaxial layer grown from the substrate 100.

The second active patterns 210A and 210B may include a second lower active pattern 210A and a second upper active pattern 210B that are sequentially stacked on the substrate 100 and spaced apart from each other. The second lower active pattern 210A may be spaced apart from the substrate 100, and the second upper active pattern 210B may be spaced apart from the second lower active pattern 210A. For example, the substrate 100, the second lower active pattern 210A, and the second upper active pattern 210B may be arranged sequentially along the third direction Z.

In some embodiments, the second lower active pattern 210A may include a plurality of sheet patterns (e.g., a fifth sheet pattern 212 and a sixth sheet pattern 213) which are sequentially stacked on the substrate 100 and spaced apart from each other. In some embodiments, the second upper active pattern 210B may include a plurality of sheet patterns (e.g., a seventh sheet pattern 214 and an eighth sheet pattern 215) that are sequentially stacked on the second lower active pattern 210A and spaced apart from each other.

In some embodiments, a second fin-shaped pattern 211 may be formed between the substrate 100 and the second lower active pattern 210A. The second fin-shaped pattern 211 may protrude from an upper side of the substrate 100 and extends in the second direction Y. The second fin-shaped pattern 211 may be formed by etching a part of the substrate 100 or may be an epitaxial layer grown from the substrate 100.

The first active patterns 110A and 110B and the second active patterns 210A and 210B may each include silicon (Si) or germanium (Ge) which is an elemental semiconductor material. In some embodiments, the first active patterns 110A and 110B and the second active patterns 210A and 210B may each include a compound semiconductor, for example, a group IV-IV compound semiconductor or a group III-V compound semiconductor. The group IV-IV compound semiconductor may include, for example, a binary compound or a ternary compound including at least two or more of carbon (C), silicon (Si), germanium (Ge) and tin (Sn), or a compound obtained by doping these elements with a group IV element. The group III-V compound semiconductor may be, for example, one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

In some embodiments, separation patterns 311 and 312 may be formed between the first and second lower active patterns 110A and 210A and the first and second upper active patterns 110B and 210B, respectively. For example, a separation pattern 311 may be formed between the first lower active pattern 110A and the first upper active pattern 110B. The separation patterns 311 and 312 may be spaced apart respectively from the first and second lower active patterns 110A and 210A, and the first and second upper active patterns 110B and 210B may be spaced apart respectively from the separation patterns 311 and 312. For example, the first lower active pattern 110A, the separation pattern 311, and the first upper active pattern 110B may be arranged sequentially along the third direction Z, and the second lower active pattern 210A, the separation pattern 312, and the second upper active pattern 210B may be arranged sequentially along the third direction Z.

The separation patterns 311 and 312 may include an insulating material, for example, but not limited to, at least one of silicon oxide, silicon nitride, silicon oxynitride, silicon oxycarbide, silicon boronitride, silicon boron carbonitride, silicon oxycarbonitride, and combinations thereof. In some other embodiments, the separation patterns 311 and 312 may be omitted.

The field insulating film 102 may be formed on the substrate 100. In some embodiments, the field insulating film 102 may cover at least a part of the side surface of the first fin-shaped pattern 111 and at least a part of the side surface of the second fin-shaped pattern 211. The field insulating film 102 may include, for example, but not limited to, at least one of a silicon oxide film, a silicon nitride film, a silicon oxynitride film, and combinations thereof.

A first gate structure G1 and a second gate structure G2 may be formed on the substrate 100 and the field insulating film 102. The first gate structure G1 and the second gate structure G2 may extend side by side in the second direction X. That is, the first gate structure G1 and the second gate structure G2 each extend long in the second direction X, and may be arranged along the first direction Y. The first gate structure G1 and the second gate structure G2 may intersect the first active patterns 110A and 110B and the second active patterns 210, respectively.

The first gate structure G1 and the second gate structure G2 may surround the peripheries of the first active patterns 110A and 110B and the peripheries of the second active patterns 210, respectively. That is, the first active patterns 110A and 110B and the second active patterns 210A and 210B may each extend in the first direction Y and penetrate the first gate structure G1 and the second gate structure G2.

The first gate structure G1 and the second gate structure G2 may each include a lower gate region R1 and an upper gate region R2.

The lower gate region R1 may extend in the second direction X on the substrate 100 and the field insulating film 102. The first and second lower active patterns 110A and 210A may extend in the first direction Y and penetrate the lower gate region R1.

The upper gate region R2 may extend in the second direction X on the lower gate region R1. The first and second upper active patterns 110B and 210B may extend in the first direction Y and penetrate the upper gate region R2. Also, the upper gate region R2 may be connected to the lower gate region R1. For example, the upper gate region R2 may be stacked directly above the lower gate region R1.

In some embodiments, the separation patterns 311 and 312 may be interposed between the lower gate region R1 and the upper gate region R2. For example, the boundary between the lower gate region R1 and the upper gate region R2 may be adjacent to side surfaces of the separation patterns 311 and 312.

The first gate structure G1 and the second gate structure G2 may each include a gate dielectric film 120, gate electrodes 131A to 134A and 131B to 134B, and a gate spacer 140.

The gate electrodes 131A to 134A and 131B to 134B may each include conductive materials, for example, but not limited to, at least one of TiN, WN, TaN, Ru, TiC, TaC, Ti, Ag, Al, TiAl, TiAlN, TiAlC, TaCN, TaSiN, Mn, Zr, W, Al, and combinations thereof. The gate electrodes 131A to 134A and 131B to 134B may each be formed, but not limited to, by a replacement process.

Although the gate electrodes 131A to 134A and 131B to 134B are each shown as a single film, this is only an example, and in some embodiments each of the gate electrodes 131A to 134A and 131B to 134B may be formed by stacking a plurality of conductive films. For example, the gate electrodes 131A to 134A and 131B to 134B may each include a work function adjusting film that adjusts the work function, and a filling conductive film that fills a space formed by the work function adjusting film. The work function adjusting film may include, for example, at least one of TiN, TaN, TiC, TaC, TiAlC, and combinations thereof. The filling conductive film may include, for example, W or Al.

In some embodiments, the lower gate region R1 and the upper gate region R2 may include different conductive materials from each other. For example, the lower gate region R1 and the upper gate region R2 may include work function adjusting films of different conductivity types from each other. As an example, the lower gate region R1 may include a p-type work function adjusting film, and the upper gate region R2 may include an n-type work function adjusting film. In some other embodiments, the lower gate region R1 and the upper gate region R2 may include the same conductive material as each other.

The gate dielectric film 120 may be interposed between the active patterns 110A, 110B, 210A and 210B and the gate electrodes 131A to 134A and 131B to 134B. The gate dielectric film 120 may include a dielectric material, for example, at least one of silicon oxide, silicon oxynitride, silicon nitride or a high dielectric constant material having a higher dielectric constant than silicon oxide. The high dielectric constant material may include, for example, but not limited to, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

The gate spacer 140 may be formed on the substrate 100 and the field insulating film 102. The gate spacer 140 may cover the side surfaces of the gate electrodes 131A to 134A and 131B to 134B. For example, the gate spacers 140 may extend in the second direction X along the side surfaces of the gate electrodes 131A to 134A and 131B to 134B. In some embodiments, the active patterns 110A, 110B, 210A and 210B may extend in the first direction Y and penetrate the gate spacer 140.

The gate spacer 140 may include an insulating material, for example, but not limited to, at least one of silicon oxide, silicon nitride, silicon oxynitride, silicon oxycarbide, silicon boronitride, silicon boron carbonitride, silicon oxycarbonitride, and combinations thereof.

In some embodiments, the gate dielectric film 120 may include a first sub-dielectric film 122 and a second sub-dielectric film 124 that are sequentially stacked on the active patterns 110A, 110B, 210A and 210B.

The first sub-dielectric film 122 may surround the periphery of the first to fourth sheet patterns 112 to 115 and the fifth to eighth sheet patterns 212 to 215. For example, the first sub-dielectric film 122 may conformally extend along the periphery of the first to fourth sheet patterns 112 to 115 and the fifth to eighth sheet patterns 212 to 215. The first sub-dielectric film 122 may extend along the first and second fin patterns 111 and 211 exposed from the field insulating film 102. A part of the first sub-dielectric film 122 may be interposed between the active patterns 110A, 110B, 210A and 210B and the gate spacer 140.

In some embodiments, the first sub-dielectric film 122 may be an oxide film formed by oxidization of the surfaces of the active patterns 110A, 110B, 210A and 210B. As an example, when the active patterns 110A, 110B, 210A and 210B include silicon (Si), the first sub-dielectric film 122 may include silicon oxide.

The second sub-dielectric film 124 may surround the periphery of the first sub-dielectric film 122. A part of the second sub-dielectric film 124 may be interposed between the gate electrodes 131A to 134A and 131B to 134B and the gate spacers 140. For example, the second sub-dielectric film 124 may conformally extend along the periphery of the first sub-dielectric film 122 and the profile of the inner surface of the gate spacer 140. Also, the second sub-dielectric film 124 may further extend along the upper surface of the field insulating film 102.

In some embodiments, the second sub-dielectric film 124 may include a high dielectric constant material having a higher dielectric constant than silicon oxide.

A lower source/drain region 160A may be formed on at least one side of the lower gate region R1. The first and second lower active patterns 110A and 210A may penetrate the lower gate region R1 and gate spacers 140, and be connected to the lower source/drain region 160A. The lower source/drain region 160A may be electrically insulated from the lower gate region R1 by the gate spacer 140 (see, e.g., FIG. 6).

In some embodiments, the lower source/drain region 160A may include an epitaxial layer. For example, the lower source/drain region 160A may be an epitaxial layer that is grown from the first and second lower active patterns 110A and 210A by an epitaxial growth method.

The upper source/drain region 160B may be formed on at least one side of the upper gate region R2. The first and second upper active patterns 110B and 210B may penetrate the upper gate region R2 and the gate spaces 140, and be connected to the upper source/drain region 160B. Also, the upper source/drain region 160B may be electrically insulated from the upper gate region R2 by the gate spacer 140 (see, e.g., FIG. 6).

In some embodiments, the upper source/drain region 160B may include an epitaxial layer. For example, the upper source/drain region 160B may be an epitaxial layer that is grown from the first and second upper active patterns 110B and 210B by the epitaxial growth method.

The lower source/drain region 160A may have a first conductivity type, and the upper source/drain region 160B may have a second conductivity type different from the lower source/drain region 160A. As an example, the first conductivity type may be a p-type and the second conductivity type may be an n-type. In such a case, the first and second lower active patterns 110A and 210A may be used as a channel region of NFET, and the first and second upper active patterns 110B and 210B may be used as a channel region of PFET. However, this is exemplary only, and it goes without saying that the first conductivity type may be the p-type and the second conductivity type may be the n-type.

A first cutting pattern GC1, a second cutting pattern GC2, and a third cutting pattern GC3 may be formed on the substrate 100 and the field insulating film 102. The first to third cutting patterns GC1, GC2 and GC3 may extend side by side in the first direction Y. That is, the first to third cutting patterns GC1, GC2 and GC3 may extend long in the first direction Y and be arranged along the second direction X, respectively.

The first to third cutting patterns GC1, GC2 and GC3 may extend in the first direction Y to cut the first gate structure G1 and/or the second gate structure G2. For example, the first cutting pattern GC1 interposed between the first active patterns 110A and 110B and the second active patterns 210A and 210B may be formed. The second cutting pattern GC2 spaced apart from the first cutting pattern GC1 with the first active patterns 110A and 110B interposed therebetween may be formed. The third cutting pattern GC3 spaced apart from the first cutting pattern GC1 with the second active patterns 210A and 210B interposed therebetween may be formed. The first to third cutting patterns GC1 to GC3 may each extend in the first direction Y to cut the first gate structure G1 and the second gate structure G2.

As an example, the lower gate region R1 of the first gate structure G1 may include a first lower gate electrode 131A and a second lower gate electrode 132A spaced apart from each other by the first cutting pattern GC1. As an example, the upper gate region R2 of the first gate structure G1 may include a first upper gate electrode 131B separated by the first cutting pattern GC1 and the second cutting pattern GC2. As an example, the lower gate region R1 of the second gate structure G2 may include a third lower gate electrode 133A and a fourth lower gate electrode 134A separated by the first cutting pattern GC1. As an example, the upper gate region R2 of the second gate structure G2 may include a fourth upper gate electrode 134B separated by the first cutting pattern GC1 and the third cutting pattern GC3.

Each of the first to third cutting patterns GC1, GC2 and GC3 may include an insulating material, for example, but not limited to, at least one of silicon oxide, silicon nitride, silicon oxynitride, silicon oxycarbide, silicon boronitride, silicon boron carbonitride, silicon oxycarbonitride, and combinations thereof.

Although the gate dielectric film 120 is only shown as being cut by the first to third cutting patterns GC1, GC2 and GC3, this is only an example. As another example, the gate dielectric film 120 may further extend along the side surfaces of the first to third cutting patterns GC1, GC2 and GC3.

The first gate structure G1 may include a first insulating pattern 151, and the second gate structure G2 may include a second insulating pattern 152. The first insulating pattern 151 and the second insulating pattern 152 may each be placed on the lower gate region R1. The first insulating pattern 151 and the second insulating pattern 152 may each be formed by replacement of at least a part of the upper gate region R2. As an example, the first insulating pattern 151 may be placed on the second lower gate electrode 132A. Such a first insulating pattern 151 may be arranged together with the first upper gate electrode 131B along the second direction X. As an example, the second insulating pattern 152 may be placed on the third lower gate electrode 133A.

The second insulating pattern 152 may be arranged together with the fourth upper gate electrode 134B along the second direction X.

In some embodiments, the upper surface of the first insulating pattern 151 may be coplanar with the upper surface of the first upper gate electrode 131B. In some embodiments, the lower surface of the first insulating pattern 151 may be coplanar with the lower surface of the first upper gate electrode 131B.

In some embodiments, the first cutting pattern GC1 may separate the first upper gate electrode 131B and the first insulating pattern 151. For example, the first upper gate electrode 131B may be placed on one side of the first cutting pattern GC1, and the first insulating pattern 151 may be placed on the other side of the first cutting pattern GC1. In some embodiments, the first insulating pattern 151 may be interposed between the first cutting pattern GC1 and the third cutting pattern GC3. For example, the first insulating pattern 151 may extend long in the second direction X between the first cutting pattern GC1 and the third cutting pattern GC3.

In some embodiments, the first cutting pattern GC1 may separate the fourth upper gate electrode 134B and the second insulating pattern 152. For example, the fourth upper gate electrode 134B may be placed on the other side of the first cutting pattern GC1, and the first insulating pattern 151 may be placed on one side of the first cutting pattern GC1. In some embodiments, the second insulating pattern 152 may be interposed between the first cutting pattern GC1 and the second cutting pattern GC2. For example, the second insulating pattern 152 may extend long in the second direction X between the first cutting pattern GC1 and the second cutting pattern GC2.

The first insulating pattern 151 and the second insulating pattern 152 may each include an insulating material, for example, but not limited to, at least one of silicon oxide, silicon nitride, silicon oxynitride, silicon oxycarbide, silicon boronitride, silicon boron carbonitride, silicon oxycarbonitride, and combinations thereof.

The first to fourth interlayer insulating films 320, 330, 340 and 350 may be sequentially stacked on the substrate 100 and the field insulating film 102. For example, the first interlayer insulating film 320 may cover the side surfaces of the lower source/drain regions 160A. A part of the second interlayer insulating film 330 may be interposed between the lower source/drain region 160A and the upper source/drain region 160B. A third interlayer insulating film 340 may cover the side surfaces of the upper source/drain region 160B. A fourth interlayer insulating film 350 may cover the first gate structure G1, the second gate structure G2, and the third interlayer insulating film 340. The boundary between the interlayer insulating films 320, 330, 340 and 350 are only example, and is not limited thereto.

The first to fourth lower source/drain contacts 181A, 183A, 184A and 186A may be connected to the lower source/drain region 160A. For example, the first lower source/drain contact 181A connected to the lower source/drain region 160A of the first lower active pattern 110A may be formed on one side of the second gate structure G2. As an example, the second lower source/drain contact 183A connected to the lower source/drain region 160A of the first lower active pattern 110A may be formed on one side of the first gate structure G1. For example, the third lower source/drain contact 184A connected to the lower source/drain region 160A of the second lower active pattern 210A may be formed on one side of the first gate structure G1. As an example, the fourth lower source/drain contact 186A connected to the lower source/drain region 160A of the second lower active pattern 210A may be formed on one side of the second gate structure G2.

The shape and placement of the first to fourth lower source/drain contacts 181A, 183A, 184A and 186A are only examples, and are not limited to those shown.

The first and second upper source/drain contacts 183B and 186B may be connected to the upper source/drain region 160B. For example, the first upper source/drain contact 183B connected to the upper source/drain region 160B of the first upper active pattern 110B may be formed on one side of the first gate structure G1. As an example, the second upper source/drain contact 186B connected to the upper source/drain region 160B of the second upper active pattern 210B may be formed on one side of the second gate structure G2.

The shape, placement, and the like of the first and second upper source/drain contacts 183B and 186B are exemplary only, and are not limited to those shown.

The first and second source/drain contacts 182 and 185 may be connected to the lower source/drain region 160A and the upper source/drain region 160B. As an example, the first shared source/drain contact 182 connected to the lower source/drain region 160A of the first lower active pattern 110A and the upper source/drain region 160B of the first upper active pattern 110B may be formed between the first gate structure G1 and the second gate structure G2. As an example, the second shared source/drain contact 185 connected to the lower source/drain region 160A of the second lower active pattern 210A and the upper source/drain region 160B of the second upper active pattern 210B may be formed between the first gate structure G1 and the second gate structure G2.

The shape, placement or the like of the first and second shared source/drain contacts 182 and 185 are exemplary only, and are not limited to those shown.

The first overlap contact 190A may electrically connect the first upper gate electrode 131B and the second shared source/drain contact 185. For example, a part of the first overlap contact 190A may overlap the first upper gate electrode 131B, and another part of the first overlap contact 190A may overlap the second shared source/drain contact 185.

In some embodiments, the first overlap contact 190A may include a first extension P1 and a second extension P2 that extend in directions different from each other. The first extension P1 of the first overlap contact 190A may extend in the second direction X and overlap the first upper gate electrode 131B, the first cutting pattern GC1 and the first insulating pattern 151. The second extension P2 of the first overlap contact 190A may extend from the first extension P1 in the first direction Y and overlap the second shared source/drain contact 185. Accordingly, the first overlap contact 190A may be electrically spaced apart from the second lower gate electrode 132A. That is, the first upper gate electrode 131B and the second lower gate electrode 132A may be electrically insulated by the first insulating pattern 151.

The second overlap contact 190B may electrically connect the fourth upper gate electrode 134B and the first shared source/drain contact 182. For example, a part of the second overlap contact 190B may overlap the fourth upper gate electrode 134B, and another part of the second overlap contact 190B may overlap the first shared source/drain contact 182.

In some embodiments, the second overlap contact 190B may include a first extension P1 and a second extension P2 that extend in the directions different from each other. The first extension P1 of the second overlap contact 190B may extend in the second direction X and overlap the fourth upper gate electrode 134B, the first cutting pattern GC1 and the second insulating pattern 152. The second extension P2 of the second overlap contact 190B may extend in the first direction Y from the first extension P1, and overlap the first shared source/drain contact 182.

The first gate contact 192 may be connected to the second lower gate electrode 132A. In some embodiments, the first gate contact 192 may penetrate the first insulating pattern 151 and be connected to the second lower gate electrode 132A. Accordingly, the first gate contact 192 may be electrically spaced apart from the first overlap contact 190A. That is, the first gate contact 192 and the first overlap contact 190A may be electrically insulated by the first insulating pattern 151.

The second gate contact 194 may be connected to the third lower gate electrode 133A. In some embodiments, the second gate contact 194 may penetrate the second insulating pattern 152, and be connected to the third lower gate electrode 133A. Accordingly, the second gate contact 194 may be electrically spaced apart from the second overlap contact 190B. That is, the second gate contact 194 and the second overlap contact 190B may be electrically insulated by the second insulating pattern 152.

The third lower gate electrode 133A may be provided as a gate electrode of the first pass transistor PS1. For example, the second gate contact 194 may be provided as a node of the word line (WL of FIG. 1). Accordingly, the first pass transistor PS1 may be connected to the word line (WL of FIG. 1).

The first lower active pattern 110A intersecting the third lower gate electrode 133A may be provided as a channel region of the first pass transistor PS1. For example, a first landing contact 191A connected to the first lower source/drain contact 181A may be formed. The first landing contact 191A may be provided as a node of a bit line (/BL of FIG. 1). Accordingly, the first pass transistor PS1 may be connected to the bit line (/BL of FIG. 1).

In some embodiments, the first landing contact 191A may be interposed between the first active patterns 110A and 110B and the first cutting pattern GC1 in a plan view.

The first lower gate electrode 131A and the first upper gate electrode 131B may be provided as a gate electrode of the first inverter (INV1 of FIG. 1). A first lower active pattern 110A intersecting the first lower gate electrode 131A may be provided as a channel region of the first pull-up transistor PU1. For example, a second landing contact 193A connected to the second lower source/drain contact 183A may be formed. The second landing contact 193A may be provided as a power node ($V_{DD}$ of FIG. 1). A first upper active pattern 110B intersecting the first upper gate electrode 131B may be provided as a channel region of the first pull-down transistor PD1. For example, a third landing contact 193B connected to the first upper source/drain contact 183B may be formed. The third landing contact 193B may be provided as a ground node ($V_{SS}$ of FIG. 1).

In some embodiments, the second landing contact 193A may overlap the second cutting pattern GC2. In some embodiments, the third landing contact 193B may overlap the first cutting pattern GC1.

The second lower gate electrode 132A may be provided as a gate electrode of the second pass transistor PS2. For example, the first gate contact 192 may be provided as a node of a word line (WL of FIG. 1). Accordingly, the second pass transistor PS2 may be connected to the word line (WL of FIG. 1).

The second lower active pattern 210A intersecting the second lower gate electrode 132A may be provided as a channel region of the second pass transistor PS2. For example, a fourth landing contact 194A connected to the third lower source/drain contact 184A may be formed. The fourth landing contact 194A may be provided as a node of a bit line (BL of FIG. 1). Accordingly, the second pass transistor PS2 may be connected to the bit line (BL of FIG. 1).

In some embodiments, the fourth landing contact 194A may be interposed between the second active patterns 210A and 210B and the first cutting pattern GC1 in a plan view.

A fourth lower gate electrode 134A and a fourth upper gate electrode 134B may be provided as gate electrodes of the second inverter (INV2 of FIG. 1). A second lower active pattern 210A intersecting the fourth lower gate electrode 134A may be provided as a channel region of the second pull-up transistor PU2. For example, a fifth landing contact 196A connected to the fourth lower source/drain contact 186A may be formed. The fifth landing contact 196A may be provided as a power node ($V_{DD}$ of FIG. 1). The second upper active pattern 210B intersecting the fourth upper gate electrode 134B may be provided as a channel region of the second pull-down transistor PD2. For example, a sixth landing contact 196B connected to the second upper source/drain contact 186B may be formed. The sixth landing contact 196B may be provided as a ground node ($V_{SS}$ of FIG. 1).

In some embodiments, the fifth landing contact 196A may overlap the third cutting pattern GC3. In some embodiments, the sixth landing contact 196B may overlap the first cutting pattern GC1.

As described above, the first overlap contact 190A may electrically connect the first upper gate electrode 131B and the second shared source/drain contact 185. Accordingly, the input node of the first inverter (INV1 of FIG. 1) may be connected to the output node of the second inverter (INV2 of FIG. 1).

As described above, the second overlap contact 190B may electrically connect the fourth upper gate electrode 134B and the first shared source/drain contact 182. Accordingly, the input node of the second inverter (INV2 of FIG. 1) may be connected to the output node of the first inverter (INV1 of FIG. 1).

As the semiconductor device gradually becomes highly integrated, individual circuit patterns are further miniaturized to implement more semiconductor devices in the same area. Although a semiconductor device using stacked multi-gate transistors has been researched for this reason, such a semiconductor device has a difficulty in increasing the degree of integration due to the complexity of the circuit patterns.

However, the semiconductor device according to some embodiments may improve the degree of integration of stacked multi-gate transistors, by including the first insulating pattern 151 and/or the second insulating pattern 152. For example, as described above, the first insulating pattern 151 may be formed on the second lower gate electrode 132A (see FIG. 3). Since the first insulating pattern 151 replaces the gate electrode on the second lower gate electrode 132A, even if a part of the first overlap contact 190A overlaps the second lower gate electrode 132A (see FIG. 1), it is possible to cut off an electric connection between the first overlap contact 190A and first gate contact 192. Accordingly, it is possible to provide a semiconductor device having improved design flexibility and degree of integration.

Figure 6:
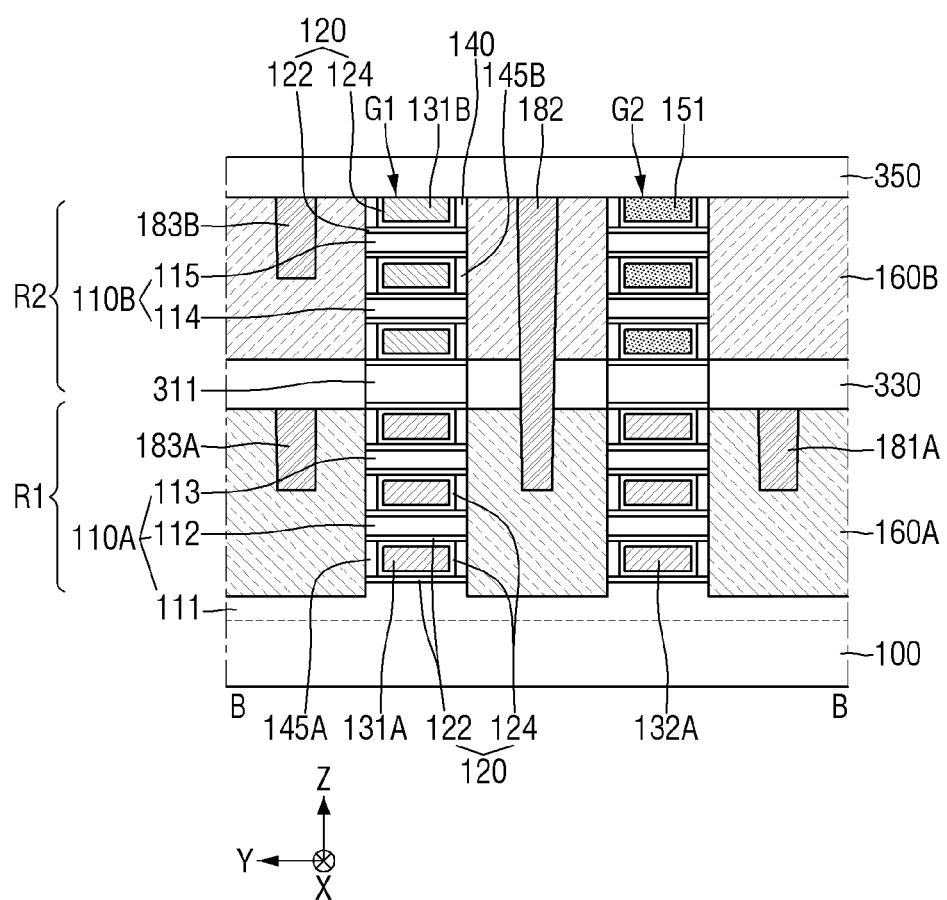
FIG. 6 is an exemplary cross-sectional view for explaining a semiconductor device according to some embodiments.

FIG. 6 is an exemplary cross-sectional view for explaining a semiconductor device according to some embodiments. For convenience of explanation and conciseness, repeated parts of contents explained above using FIGS. 1 to 5 will be briefly explained or omitted.

Referring to FIG. 6, the semiconductor device according to some embodiments includes a first inner spacer 145A and/or a second inner spacer 145B.

The first inner spacer 145A may be formed on side surfaces of the lower gate region R1 between the first and second sheet patterns 112 and 113. The first inner spacer 145A may also be formed between the first fin-shaped pattern 111 and the first sheet pattern 112. The second inner spacer 145B may be formed on the side surfaces of the upper gate region R2 between the third and fourth sheet patterns 114 and 115.

The first inner spacer 145A and the second inner spacer 145B may each include, for example, but not limited to, at least one of silicon nitride, silicon oxynitride, silicon oxycarbide, silicon boronitride, silicon boron carbonitride, silicon oxycarbonitride, and combinations thereof. The first inner spacer 145A and the second inner spacer 145B may each include the same material as the gate spacer 140, or may include a different material from the gate spacer 140.

Although FIG. 6 only shows that both the first inner spacer 145A and the second inner spacer 145B exist, this is exemplary only. In some embodiments, one of the first inner spacer 145A and the second inner spacer 145B may be omitted.

Figure 7:
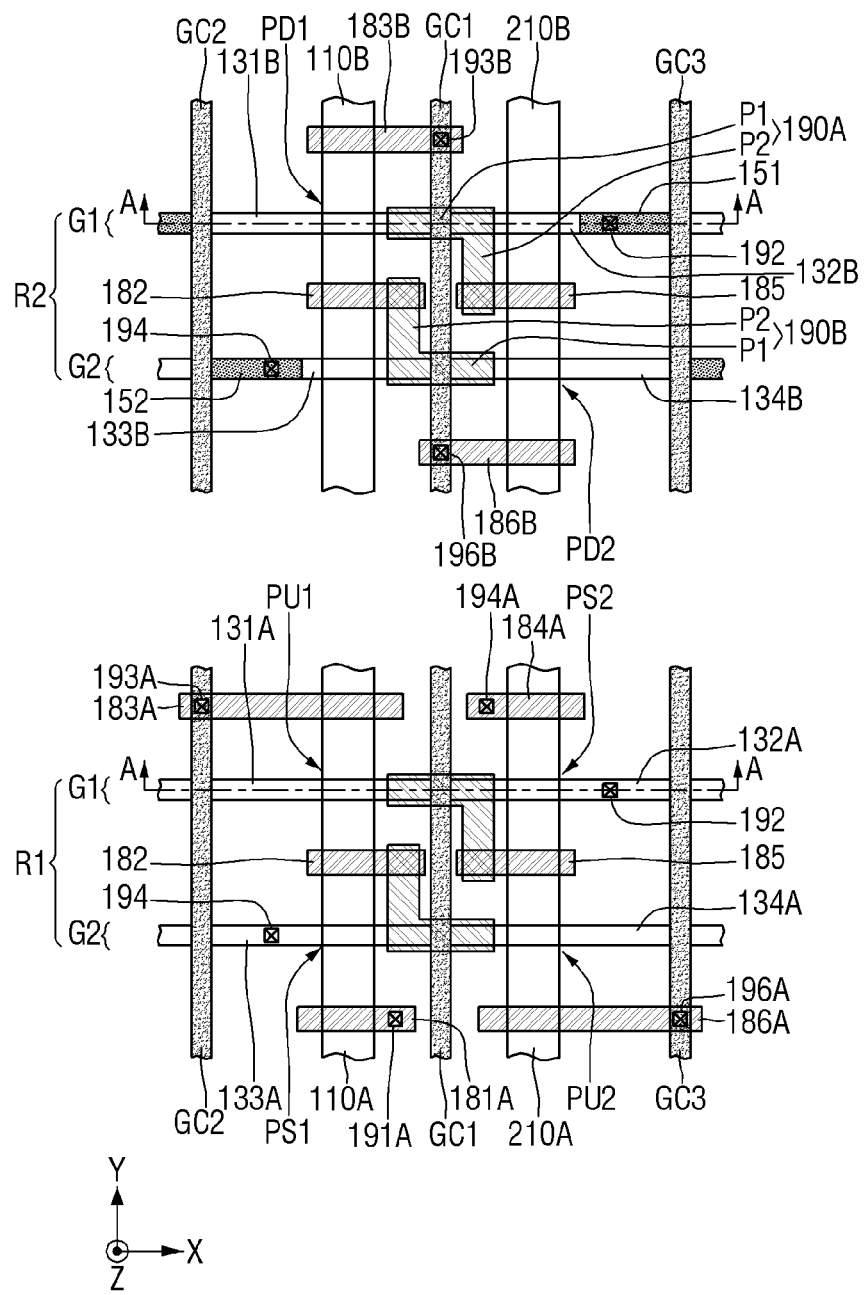
FIG. 7 is an exemplary layout diagram for explaining a semiconductor device according to some embodiments.
Figure 8:
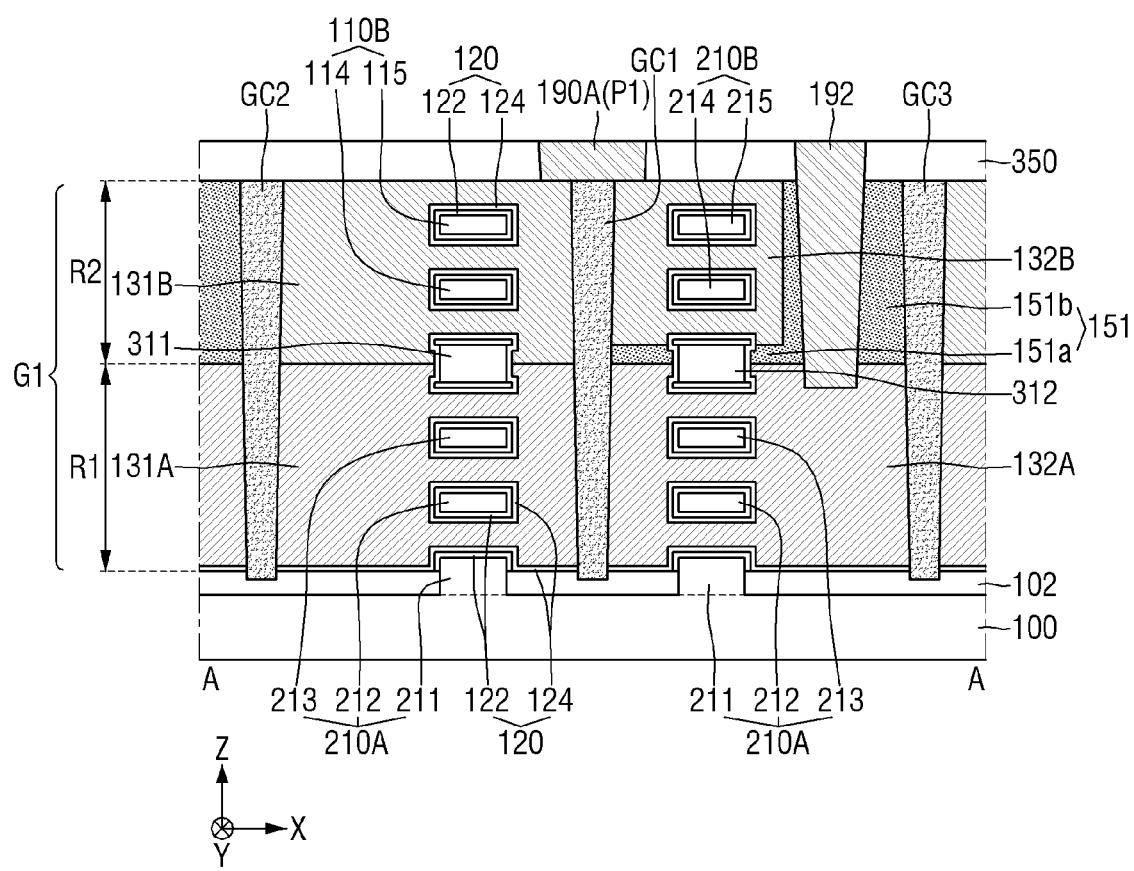
FIG. 8 is a schematic cross-sectional view taken along A-A of FIG. 7.

FIG. 7 is an exemplary layout diagram for explaining a semiconductor device according to some embodiments. FIG. 8 is a schematic cross-sectional view taken along A-A of FIG. 7. For convenience of explanation and conciseness, repeated parts of contents explained above using FIGS. 1 to 6 will be briefly explained or omitted.

Referring to FIGS. 1, 7 and 8, in the semiconductor device according to some embodiments, the upper gate region R2 of the first gate structure G1 includes the first upper gate electrode 131B and the second upper gate electrode 132B separated from each other by first cutting pattern GC1, and the upper gate region R2 of the second gate structure G2 includes a third upper gate electrode 133B and a fourth upper gate electrode 134B separated from each other by the first cutting pattern GC1.

The second upper gate electrode 132B may be electrically separated from the second lower gate electrode 132A by the first insulating pattern 151, and the third upper gate electrode 133B may be electrically separated from the third lower gate electrode 133A by the second insulating pattern 152. Although the following description focuses on the first insulating pattern 151, it will be understood that the second insulating pattern 152 may also be similar.

In some embodiments, as illustrated in FIG. 8, the first insulating pattern 151 may include a horizontal insulating portion 151a and a vertical insulating portion 151b. The horizontal insulating portion 151a may be interposed between the second lower gate electrode 132A and the second upper gate electrode 132B. The vertical insulating portion 151b may extend from the horizontal insulating portion 151a in the third direction Z. The vertical insulating portion 151b may be arranged together with the second upper gate electrode 132B along the second direction X.

The second upper gate electrode 132B may be interposed between the first cutting pattern GC1 and the vertical insulating portion 151b. The first extension P1 of the first overlap contact 190A may extend in the second direction X and overlap the first upper gate electrode 131B, the first cutting pattern GC1 and the second upper gate electrode 132B. The first gate contact 192 may penetrate the vertical insulating portion 151b and be connected to the second lower gate electrode 132A. Accordingly, the first insulating pattern 151 may electrically separate the first gate contact 192 and the first overlap contact 190A.

Figure 9:
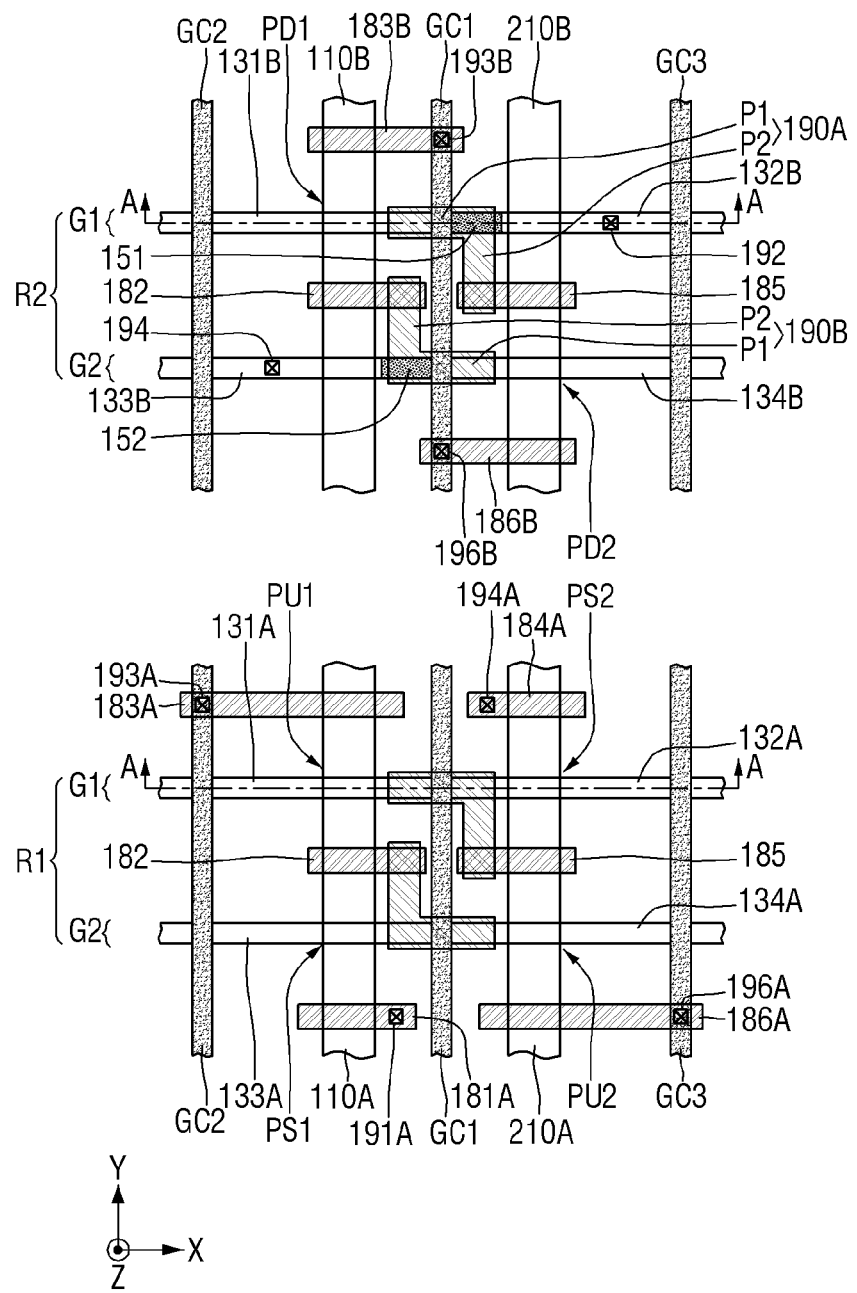
FIG. 9 is an exemplary layout diagram for explaining a semiconductor device according to some embodiments.
Figure 10:
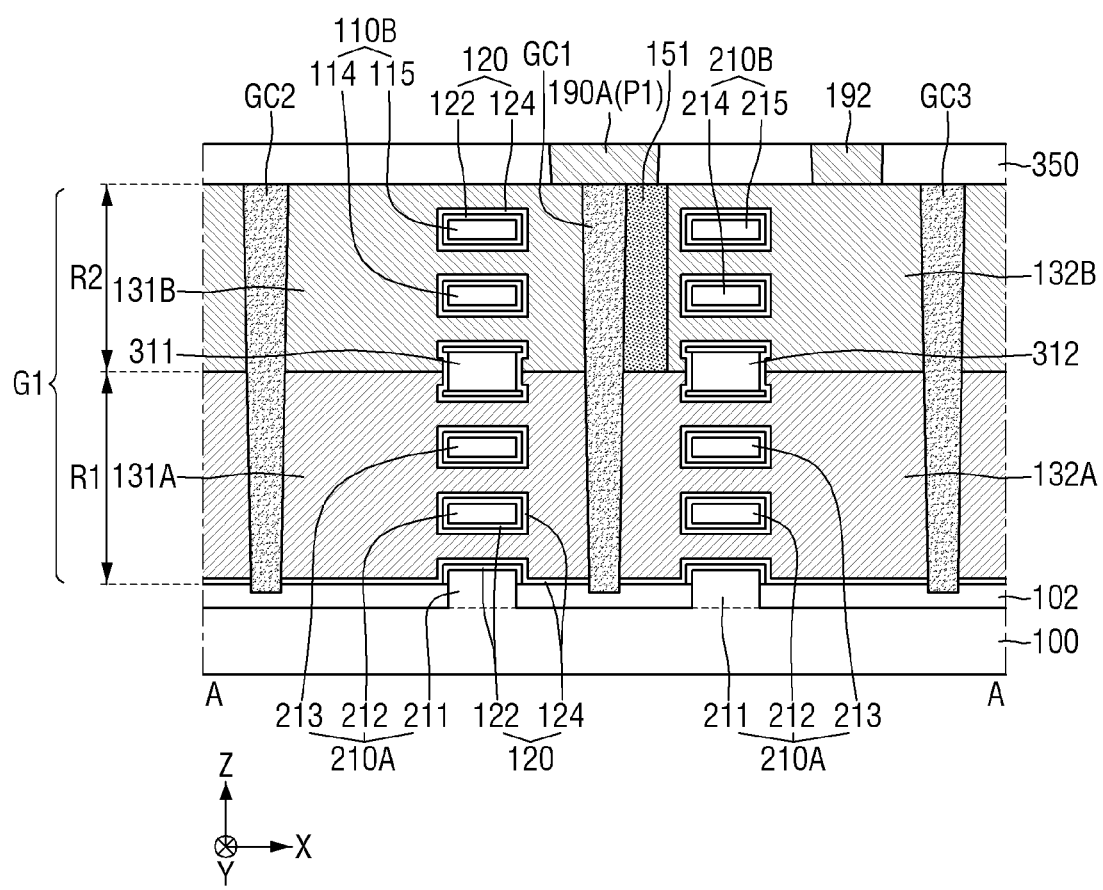
FIG. 10 is a schematic cross-sectional view taken along A-A of FIG. 9.

FIG. 9 is an exemplary layout diagram for explaining a semiconductor device according to some embodiments. FIG. 10 is a schematic cross-sectional view taken along A-A of FIG. 9. For convenience of explanation and conciseness, repeated parts of contents explained above using FIGS. 1 to 8 will be briefly explained or omitted.

Referring to FIGS. 1, 9 and 10, in the semiconductor device according to some embodiments, the first insulating pattern 151 is interposed between the first cutting pattern GC1 and the second upper gate electrode 132B, and the second insulating pattern 152 is interposed between the first cutting pattern GC1 and the third upper gate electrode 133B.

The second upper gate electrode 132B may be connected to the second lower gate electrode 132A, and the third upper gate electrode 133B may be connected to the third lower gate electrode 133A. The first gate contact 192 may be connected to the second lower gate electrode 132A through the second upper gate electrode 132B, and the second gate contact 194 may be connected to the third lower gate electrode 133A through the third upper gate electrode 133B.

The first extension P1 of the first overlap contact 190A may extend in the second direction X and overlap the first upper gate electrode 131B, the first cutting pattern GC1 and the first insulating pattern 151. Accordingly, the first insulating pattern 151 may electrically separate the first gate contact 192 and the first overlap contact 190A.

The first extension P1 of the second overlap contact 190B may extend in the second direction X and overlap the fourth upper gate electrode 134B, the first cutting pattern GC1 and the second insulating pattern 152. Accordingly, the second insulating pattern 152 may electrically separate the second gate contact 194 and the second overlap contact 190B.

Figure 11:
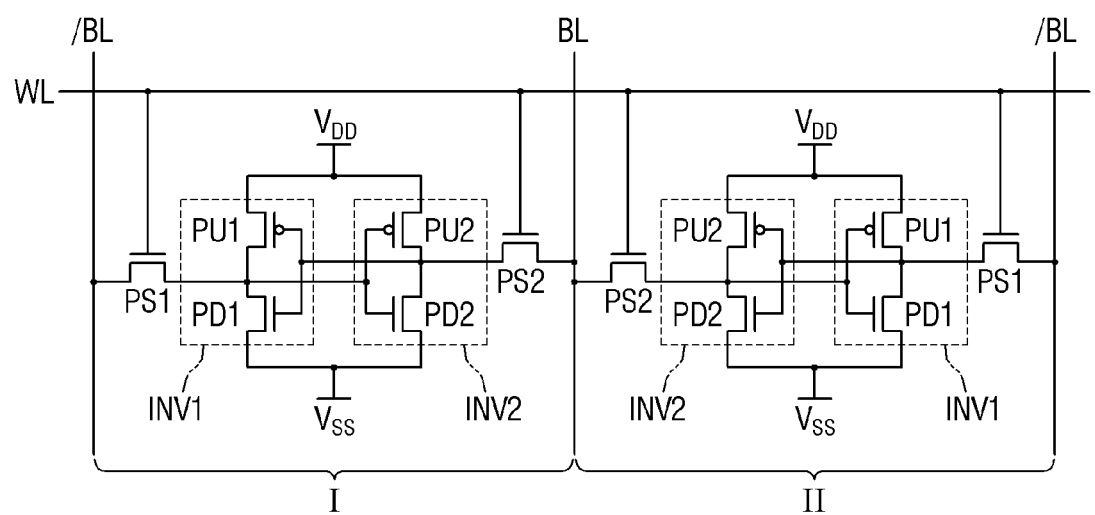
FIG. 11 is an exemplary circuit diagram for explaining a semiconductor device according to some embodiments.
Figure 12:
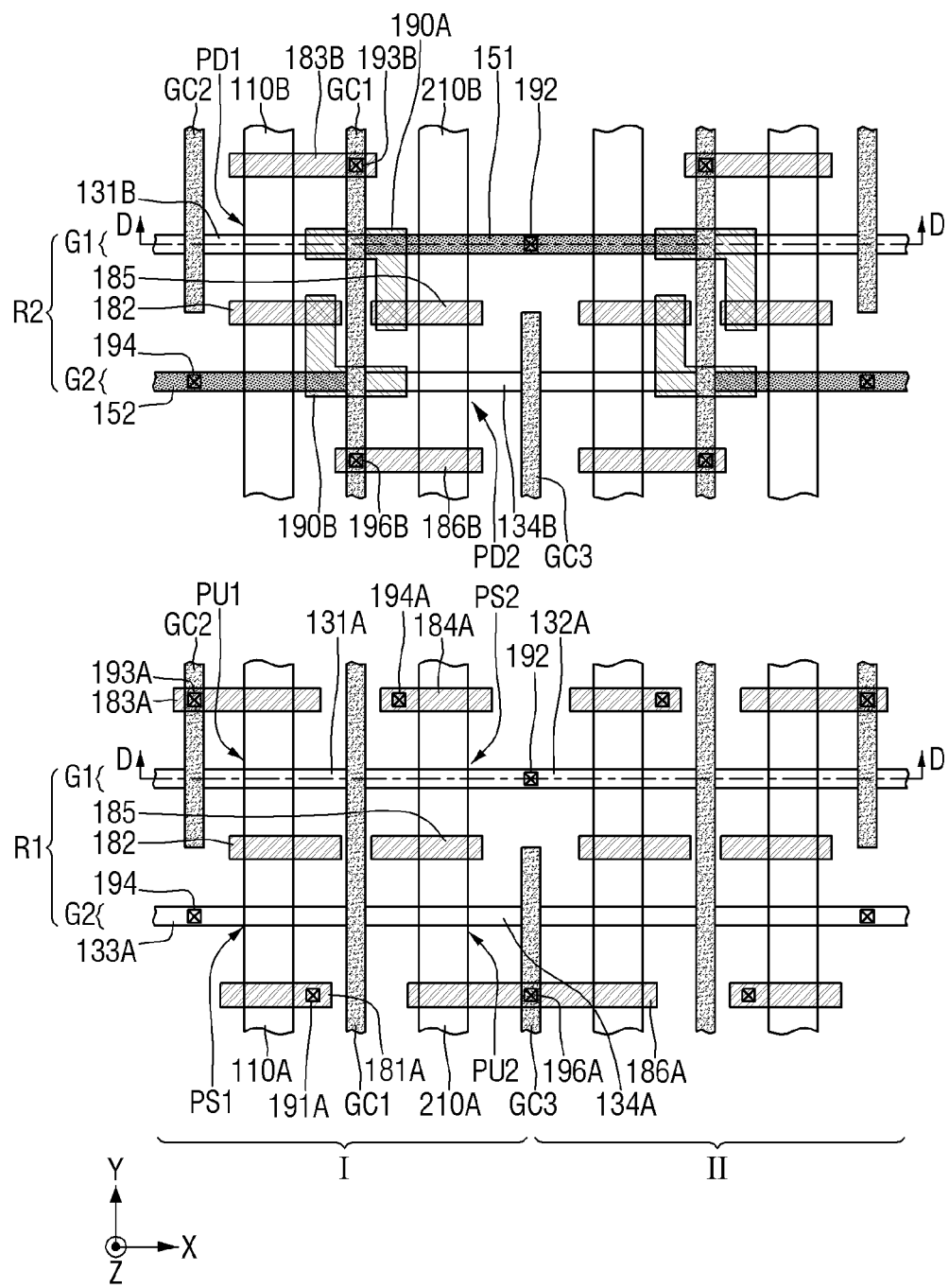
FIG. 12 is an exemplary layout diagram for explaining a semiconductor device according to some embodiments.
Figure 13:
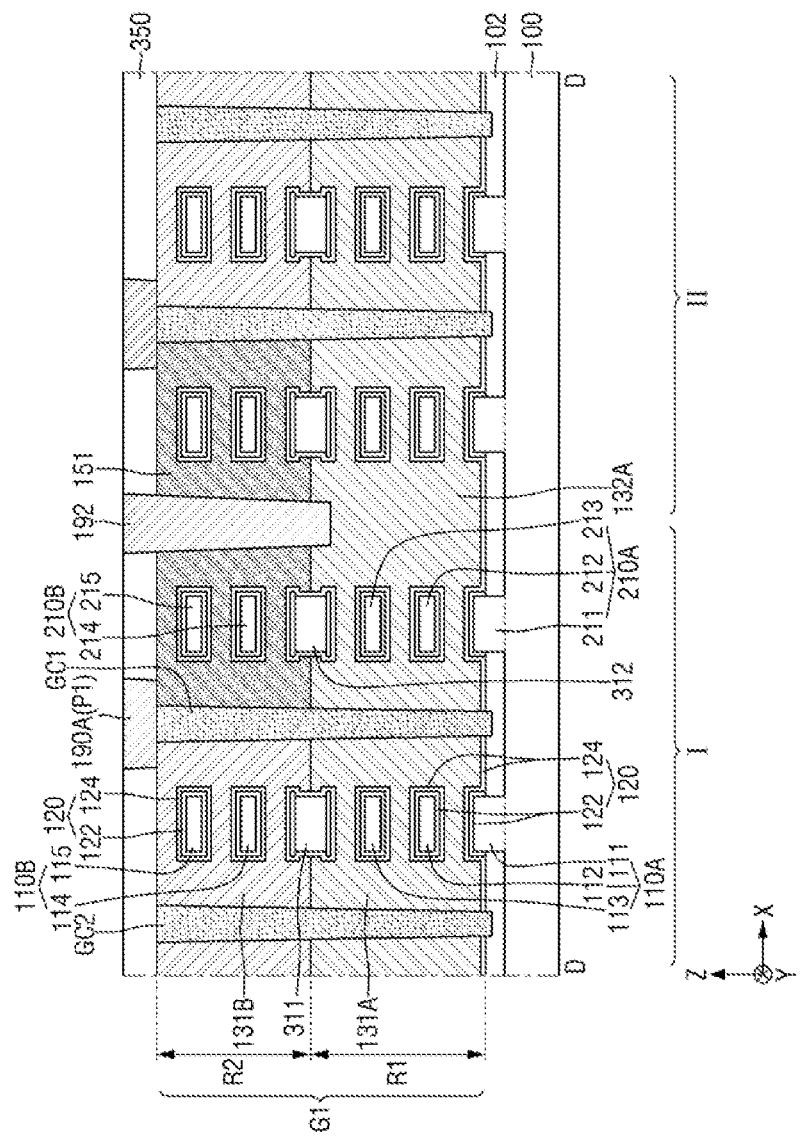
FIG. 13 is a schematic cross-sectional view taken along line D-D of FIG. 12.
Figure 14:
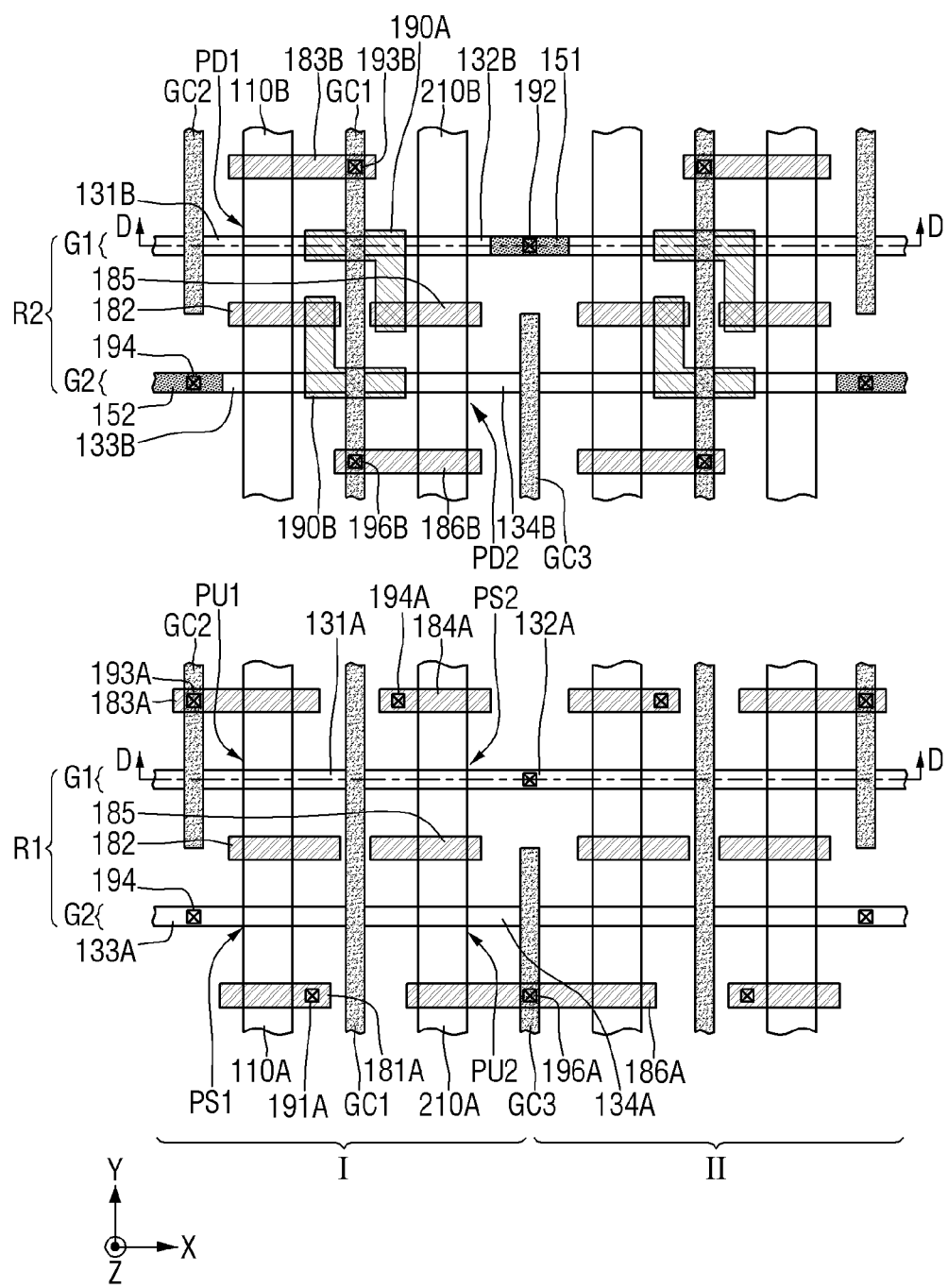
FIG. 14 is an exemplary layout diagram for explaining a semiconductor device according to some embodiments.
Figure 15:
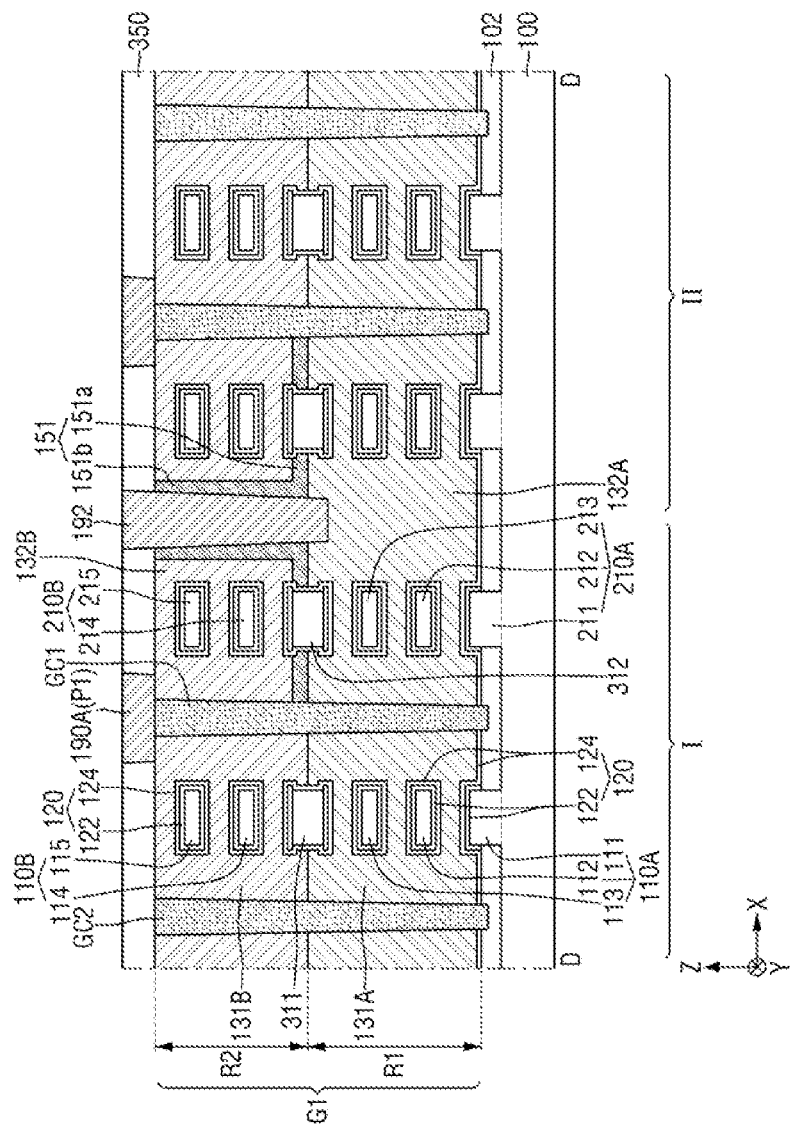
FIG. 15 is a schematic cross-sectional view taken along line D-D of FIG. 14.
Figure 16:
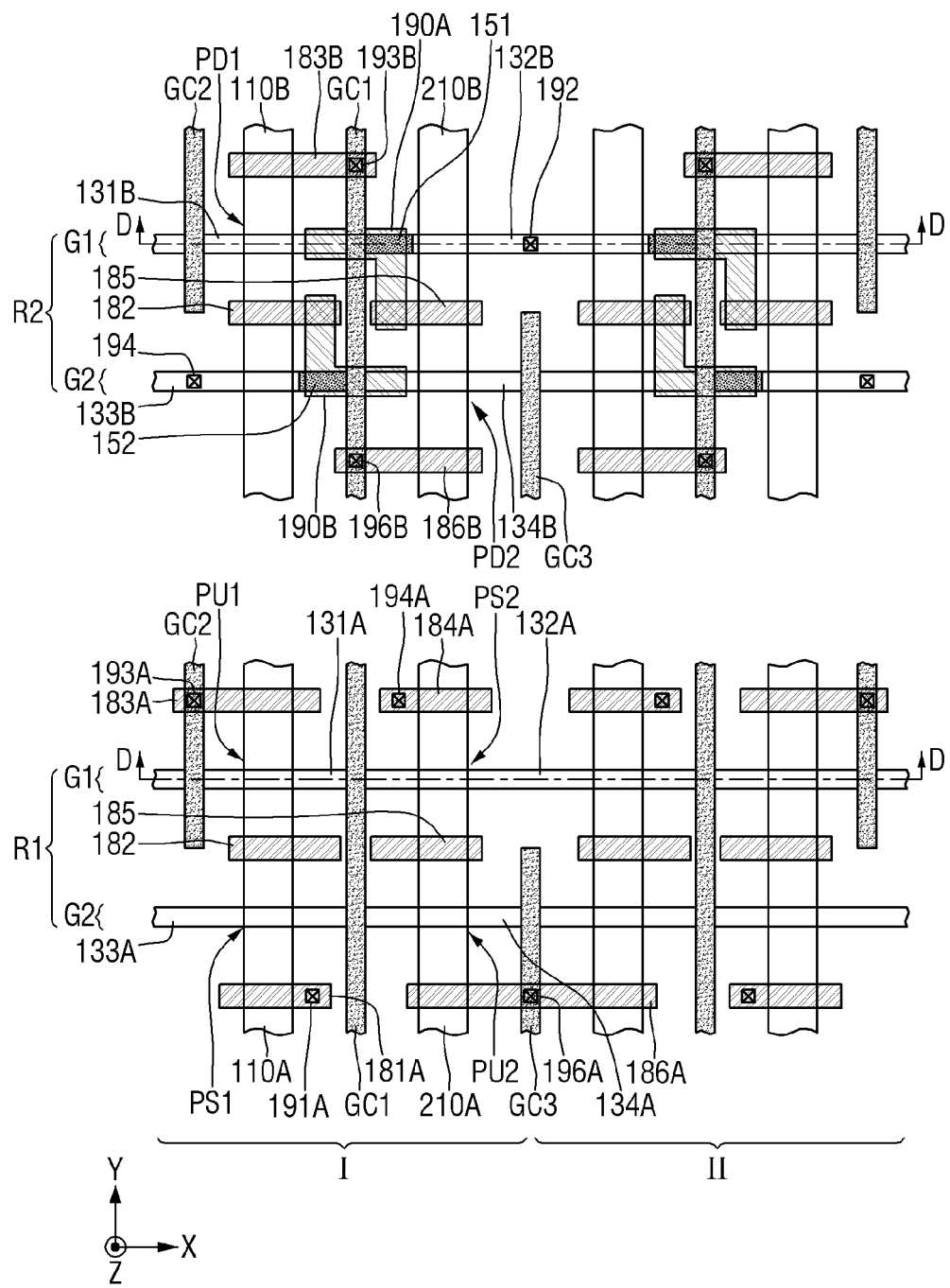
FIG. 16 is an exemplary layout diagram for explaining a semiconductor device according to some embodiments.
Figure 17:
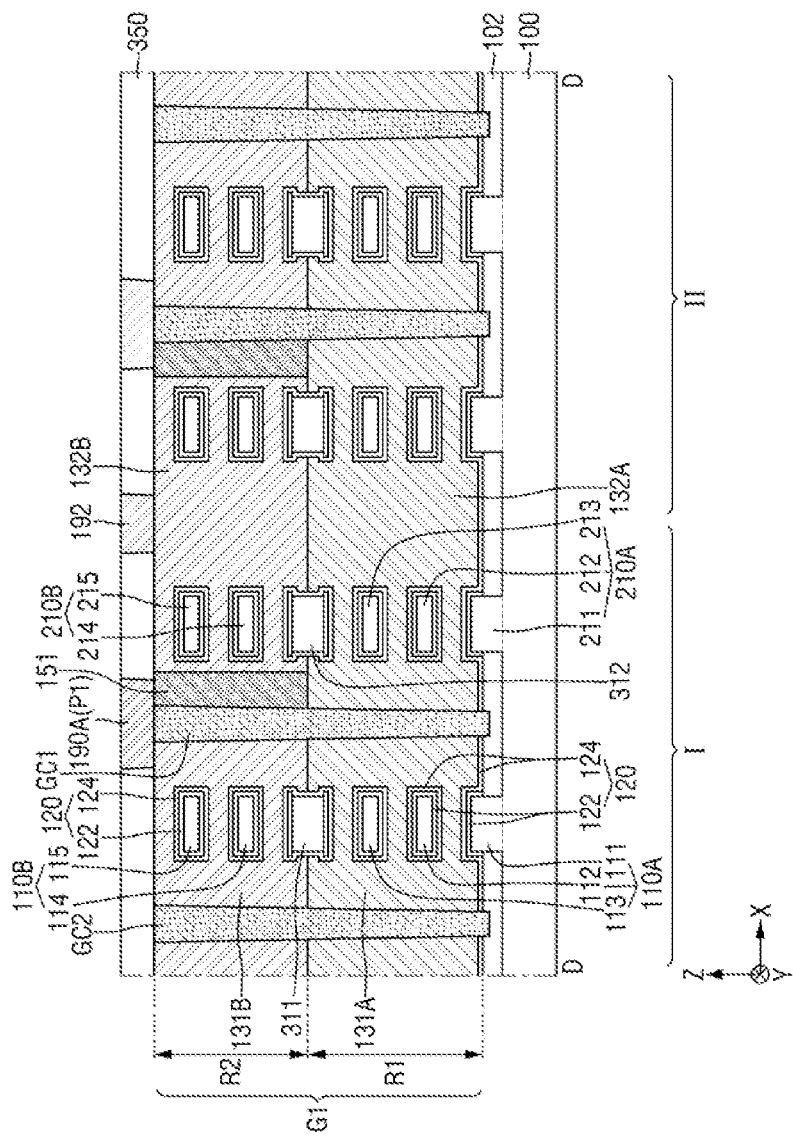
FIG. 17 is a schematic cross-sectional view taken along line D-D of FIG. 16.

FIG. 11 is an exemplary circuit diagram for explaining a semiconductor device according to some embodiments. FIG. 12 is an exemplary layout diagram for explaining a semiconductor device according to some embodiments. FIG. 13 is a schematic cross-sectional view taken along line D-D of FIG. 12. FIG. 14 is an exemplary layout diagram for explaining a semiconductor device according to some embodiments. FIG. 15 is a schematic cross-sectional view taken along line D-D of FIG. 14. FIG. 16 is an exemplary layout diagram for explaining a semiconductor device according to some embodiments. FIG. 17 is a schematic cross-sectional view taken along line D-D of FIG. 16. For convenience of explanation and conciseness, repeated parts of contents explained above using FIGS. 1 to 10 will be briefly explained or omitted.

Referring to FIG. 11, the semiconductor device according to some embodiments includes a first unit element I and a second unit element II that are adjacent to each other.

Each of the first unit element I and the second unit element II includes a pair of inverters INV1 and INV2 connected in parallel between the power supply node $V_{DD}$ and the ground node $V_{SS}$, and a first pass transistor PS1 and a second pass transistor PS2 connected to the output nodes of each of the inverters INV1 and INV2.

In some embodiments, the first unit element I and the second unit element II may share one bit line BL. For example, two complementary bit lines/BL extending parallel to each other may be formed on both sides of one bit line BL. At this time, the first unit element I may be defined between one complementary bit line/BL among the two complementary bit lines/BL and the bit line BL. The second unit element II may be defined between the other complementary bit line/BL among the two complementary bit lines/BL and the bit line BL.

Referring to FIGS. 11 to 17, in the semiconductor device according to some embodiments, each of the first unit element I and the second unit element II includes a substrate 100, first active patterns 110A and 110B, second active patterns 210, a field insulating film 102, a first gate structure G1, a second gate structure G2, a lower source/drain region 160A, an upper source/drain region 160B, first to third cutting patterns GC1, GC2 and GC3, first to fourth interlayer insulating films 320, 330, 340 and 350, first to fourth lower source/drain contacts 181A, 183A, 184A and 186A, first and second upper source/drain contacts 183B and 186B, first and second shared source/drain contacts 182 and 185, a first overlap contact 190A, a second overlap contact 190B, a first gate contact 192, and a second gate contact 194.

In some embodiments, the second cutting pattern GC2 may not intersect the second insulating pattern 152, and the third cutting pattern GC3 may not intersect the first insulating pattern 151. Further, in some embodiments, the first gate contact 192 may be arranged together with the third cutting pattern GC3 along the first direction Y, and the second gate contact 194 may be arranged together with the second cutting pattern GC2 along the first direction Y. In some embodiments, the first unit element I and the second unit element II may be arranged symmetrically on the basis of a plane passing through the third cutting pattern GC3 and the first gate contact 192. The first gate contact 192 may be provided as a node of a word line (WL of FIG. 11). Accordingly, the first unit element I and the second unit element II may share one word line (WL of FIG. 11). This makes it possible to provide a semiconductor device having a further improved degree of integration.

Referring to FIGS. 11 to 13, in the semiconductor device according to some embodiments, the first extension P1 of the first overlap contact 190A overlaps the first insulating pattern 151, and the first gate contact 192 penetrates the first insulating pattern 151 and is connected to the second lower gate electrode 132A. The first extension P1 of the second overlap contact 190B overlaps the first insulating pattern 151, and the second gate contact 194 penetrates the second insulating pattern 152 and is connected to the third lower gate electrode 133A. Since this configuration may be similar to the configuration described above using FIGS. 2 to 5, a detailed description will not be provided below for conciseness.

Referring to FIGS. 11, 14 and 15, in the semiconductor device according to some embodiments, the first insulating pattern 151 and the second insulating pattern 152 each include a horizontal insulating portion 151a and a vertical insulating portion 151b. Since this configuration may be similar to the configuration described above using FIGS. 7 and 8, a detailed description will not be provided below for conciseness.

Referring to FIGS. 11, 16 and 17, in the semiconductor device according to some embodiments, the first insulating pattern 151 is interposed between the first cutting pattern GC1 and the second upper gate electrode 132B, and the second insulating pattern 152 is interposed between the first cutting pattern GC1 and the third upper gate electrode 133B. Since this configuration may be similar to the configuration described above using FIGS. 9 and 10, detailed description will not be provided below for conciseness.

Figure 18:
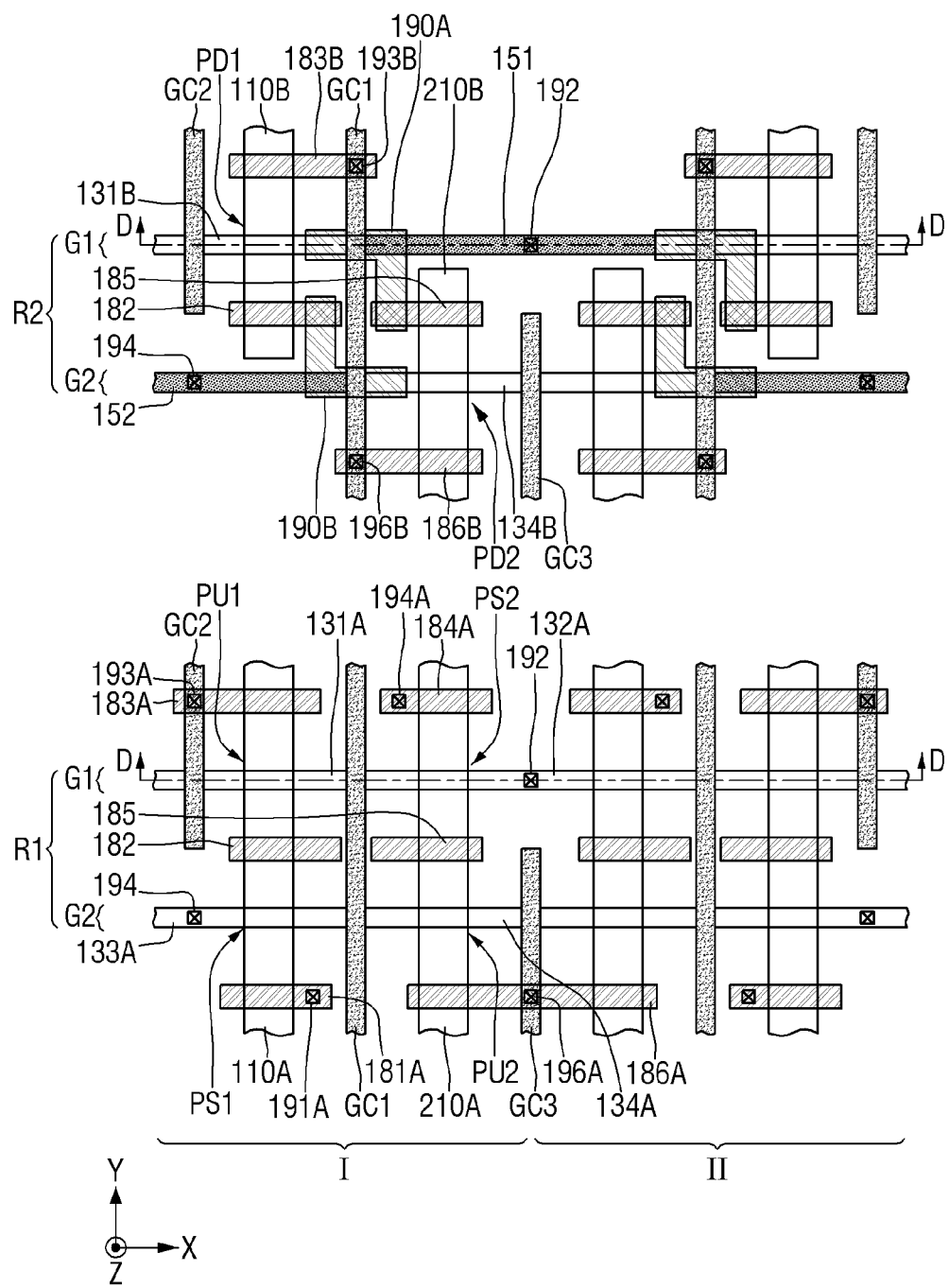
FIG. 18 is an exemplary layout diagram for explaining a semiconductor device according to some embodiments.
Figure 19:
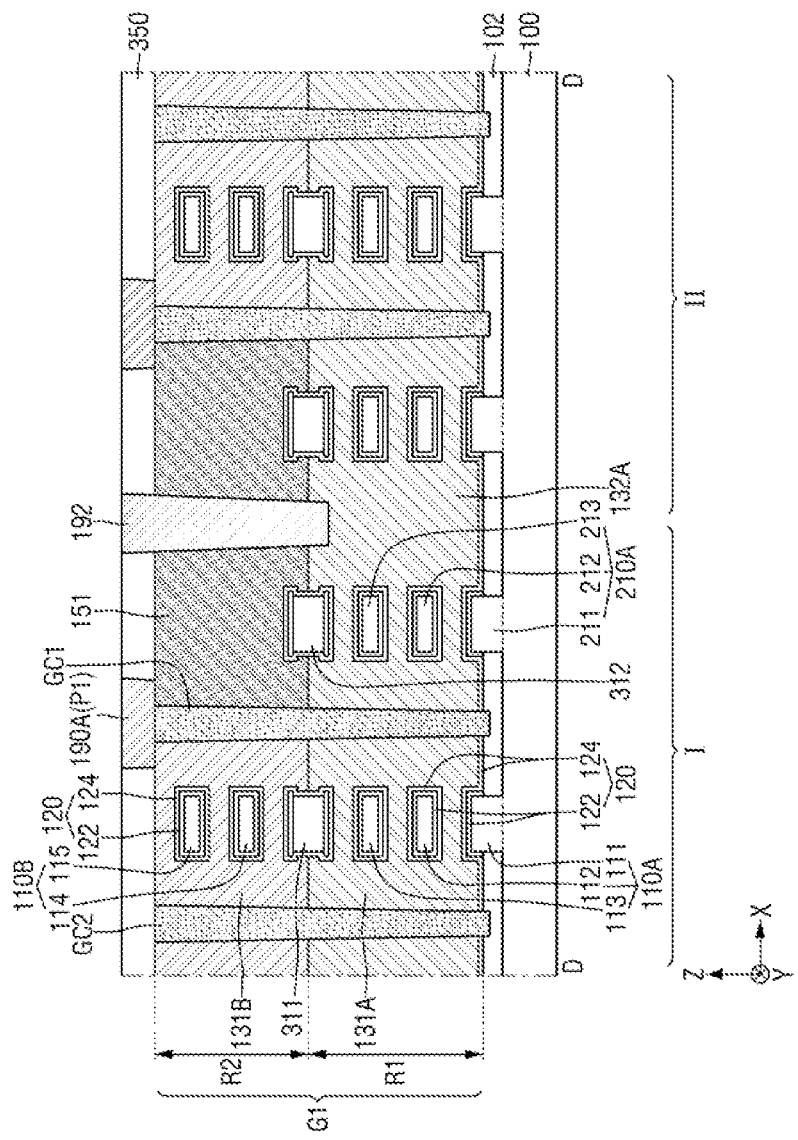
FIG. 19 is a schematic cross-sectional view taken along line D-D of FIG. 18.
Figure 20:
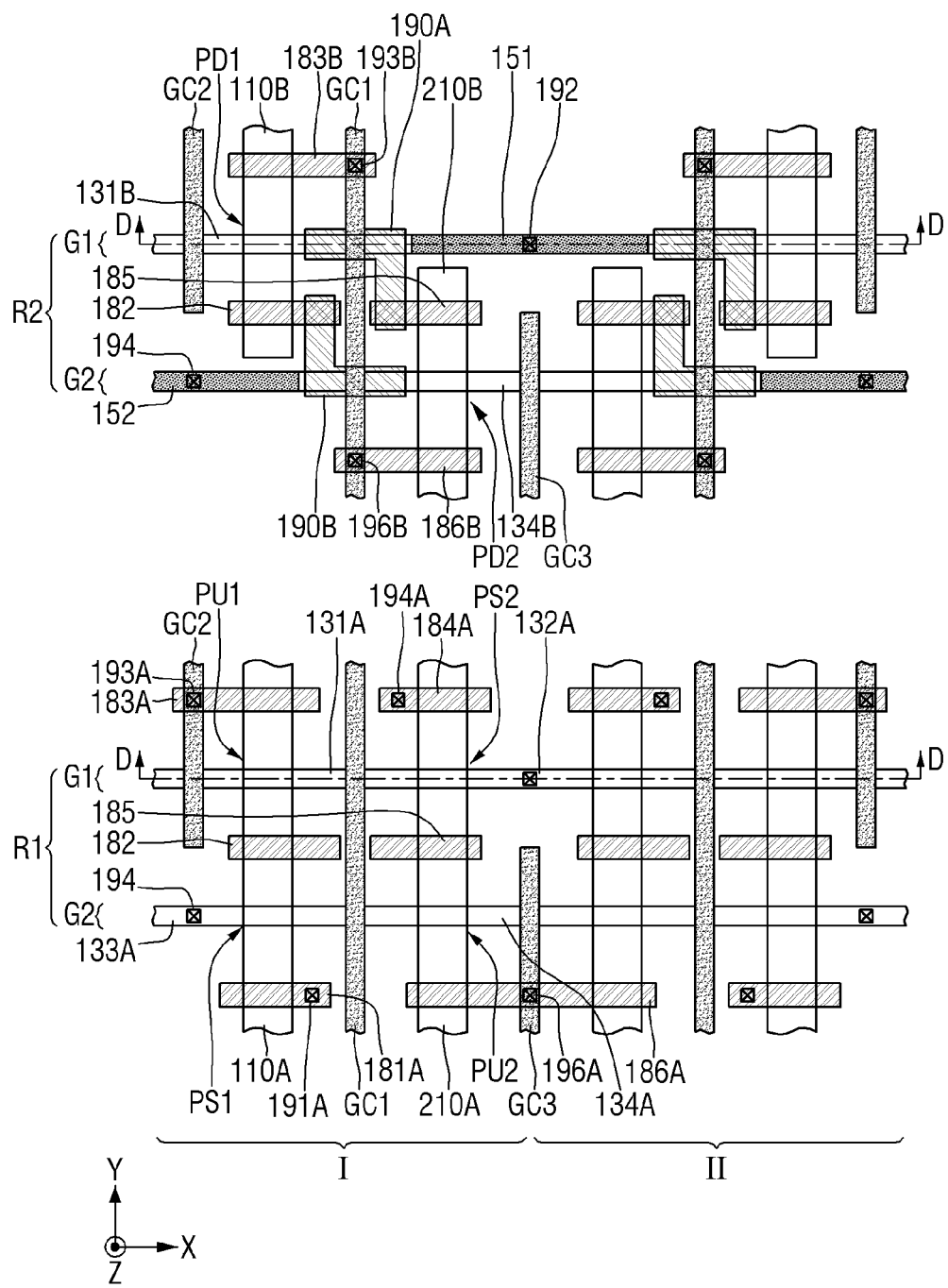
FIG. 20 is an exemplary layout diagram for explaining a semiconductor device according to some embodiments.
Figure 21:
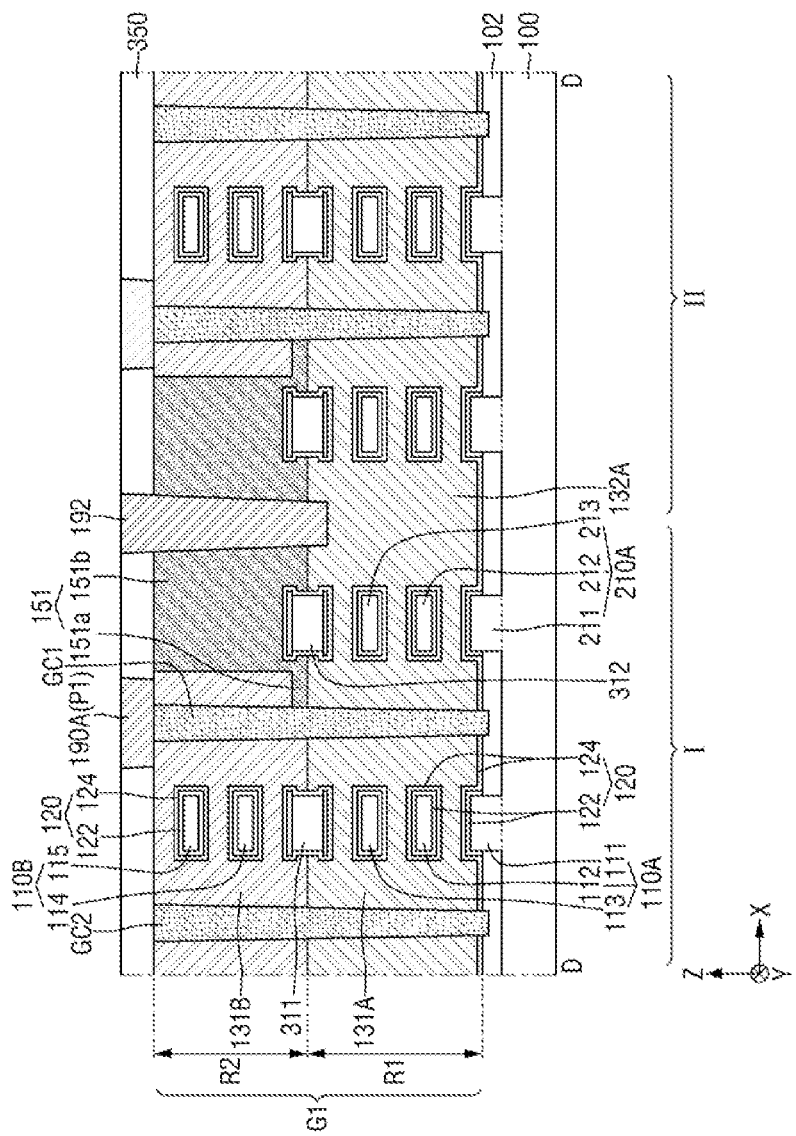
FIG. 21 is a schematic cross-sectional view taken along line D-D of FIG. 20.
Figure 22:
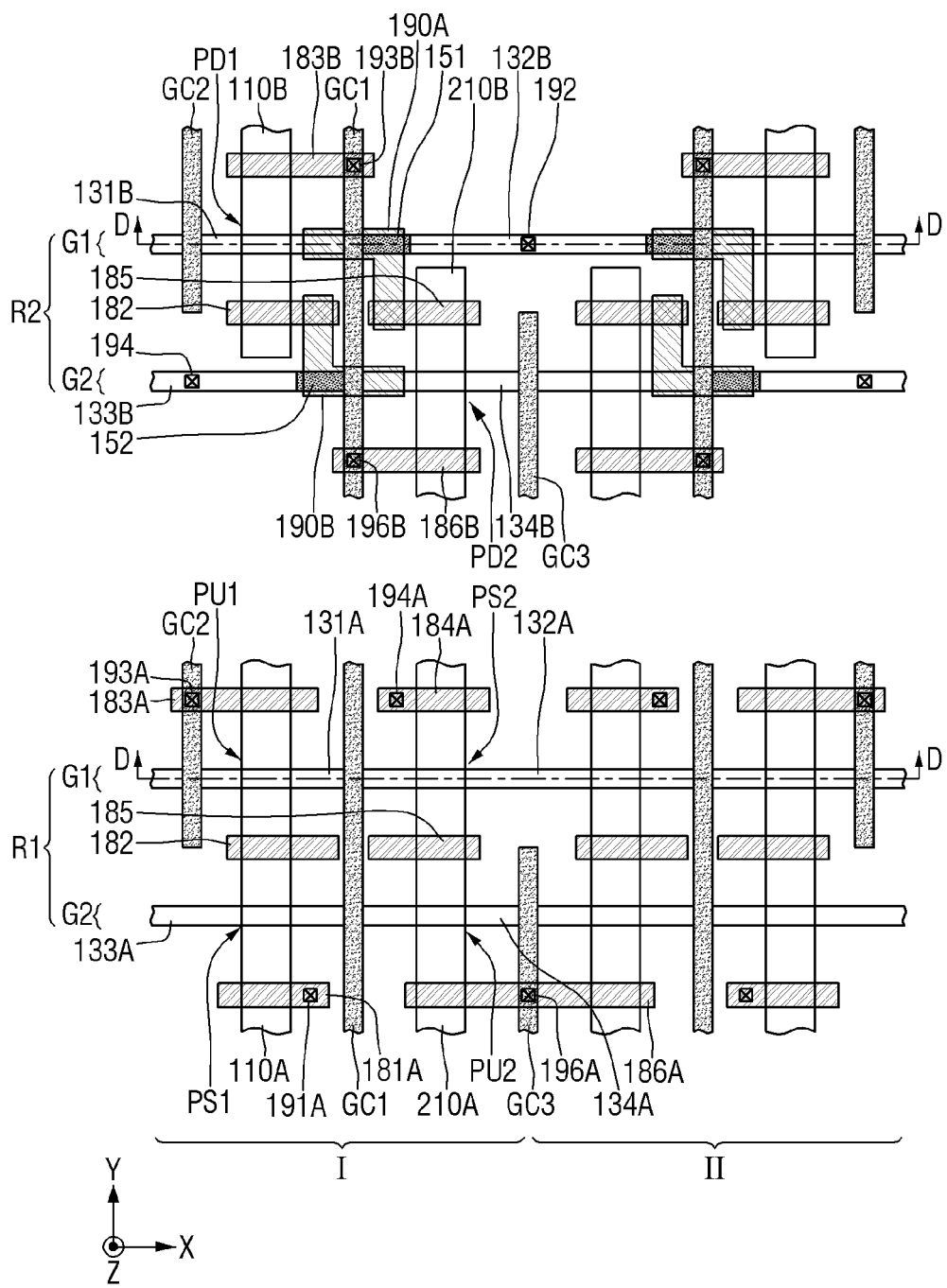
FIG. 22 is an exemplary layout diagram for explaining a semiconductor device according to some embodiments.
Figure 23:
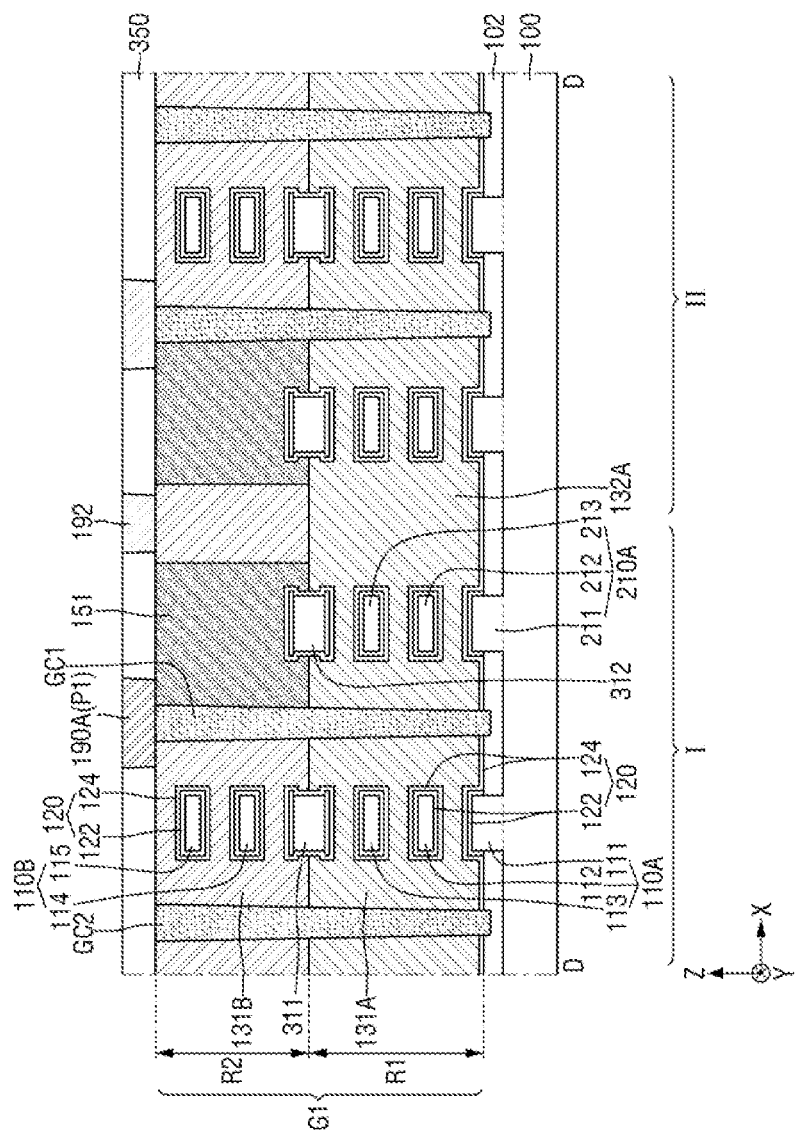
FIG. 23 is a schematic cross-sectional view taken along line D-D of FIG. 22.

FIG. 18 is an exemplary layout diagram for explaining a semiconductor device according to some embodiments. FIG. 19 is a schematic cross-sectional view taken along line D-D of FIG. 18. FIG. 20 is an exemplary layout diagram for explaining a semiconductor device according to some embodiments. FIG. 21 is a schematic cross-sectional view taken along line D-D of FIG. 20. FIG. 22 is an exemplary layout diagram for explaining a semiconductor device according to some embodiments. FIG. 23 is a schematic cross-sectional view taken along line D-D of FIG. 22. For convenience of explanation and conciseness, repeated parts of contents explained above using FIGS. 1 to 17 will be briefly explained or omitted.

Referring to FIGS. 11 and 18 to 23, in the semiconductor device according to some embodiments, the first upper active pattern 110B does not intersect the second insulating pattern 152, and the second upper active pattern 210B does not intersect the first insulating pattern 151.

In such a case, a process margin of the first gate contact 192 and the second gate contact 194 may be improved. In addition, it is possible to reduce a parasitic capacitance that may be generated in the second insulating pattern 152 by the first upper active pattern 110B, and a parasitic capacitance that may be generated in the first insulating pattern 151 by the second upper active pattern 210B. Accordingly, it is possible to provide a semiconductor device having further improved design flexibility and degree of integration.

A method for fabricating a semiconductor device according to exemplary embodiments will be described with reference to FIGS. 1 to 37.

FIGS. 24 to 30 are intermediate step diagrams for explaining the method for fabricating a semiconductor memory device according to some embodiments. For convenience of explanation and conciseness, repeated parts of contents explained above using FIGS. 1 to 23 will be briefly explained or omitted.

Figure 24:
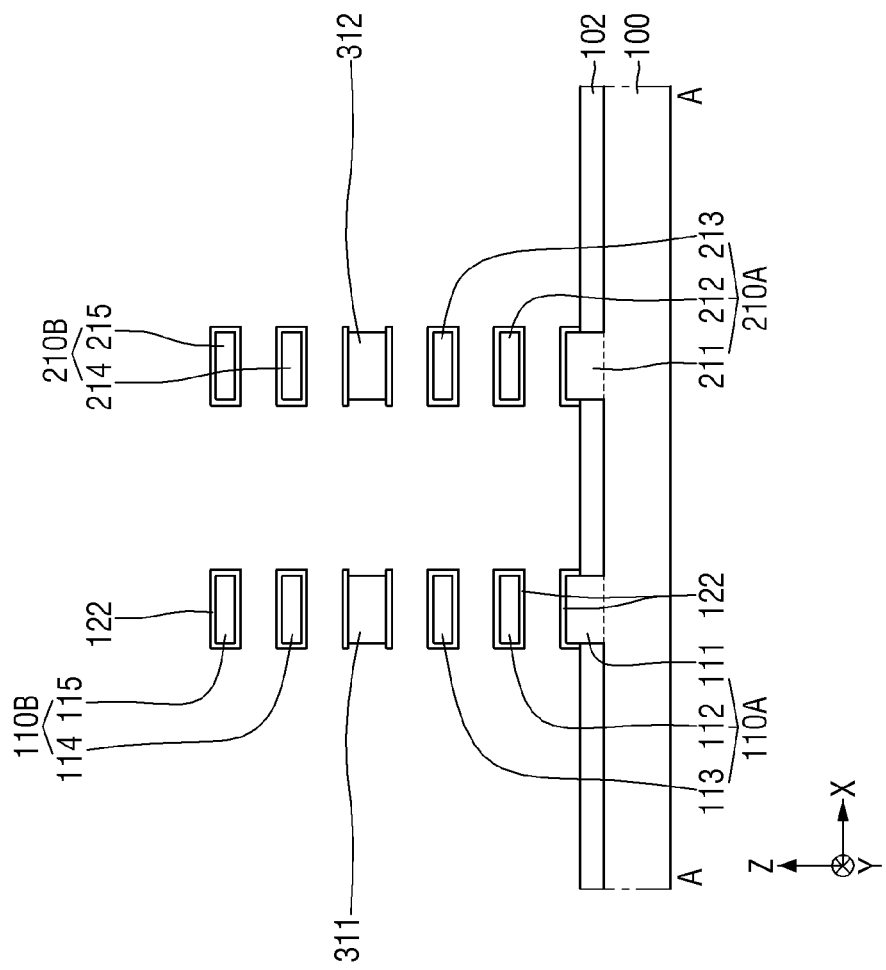
FIGS. 24 to 30 are intermediate step diagrams for explaining the method for fabricating a semiconductor memory device according to some embodiments.

Referring to FIG. 24, first active patterns 110A and 110B and second active patterns 210A and 210B are formed on the substrate 100.

The first active patterns 110A and 110B may include a first lower active pattern 110A and a first upper active pattern 110B that are sequentially stacked on the substrate 100 and spaced apart from each other. The second active patterns 210A and 210B may include a second lower active pattern 210A and a second upper active pattern 210B that are sequentially stacked on the substrate 100 and spaced apart from each other.

For example, sacrificial patterns that are stacked alternately with the first active patterns 110A and 110B and the second active patterns 210A and 210B may be formed on the substrate 100. The sacrificial patterns may include a material having an etching selectivity with the first active patterns 110A and 110B and the second active patterns 210. As an example, the first active patterns 110A and 110B and the second active patterns 210A and 210B may each include silicon (Si), and the sacrificial patterns may include silicon germanium (SiGe). The sacrificial pattern may then be selectively removed.

In some embodiments, a first sub-dielectric film 122 may be formed on the surfaces of the active patterns 110A, 110B, 210A and 210B. The first sub-dielectric film 122 may be, but not limited to, an oxide film formed by oxidation of the surfaces of the active patterns 110A, 110B, 210A and 210B.

Figure 25:
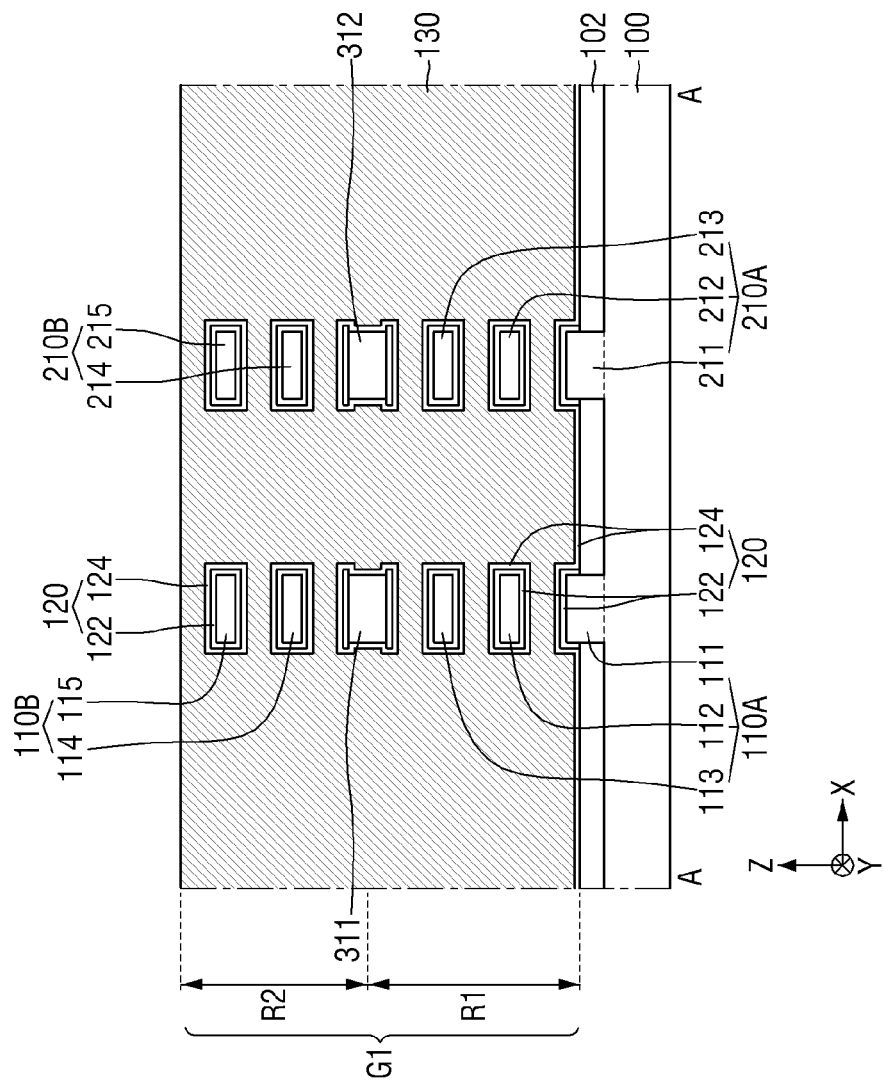

Referring to FIG. 25, a gate dielectric film 120 and a preliminary gate electrode 130 are sequentially formed.

For example, a second sub-dielectric film 124 may be formed on the first sub-dielectric film 122 and the field insulating film 102. The second sub-dielectric film 124 may include, but not limited to, a high dielectric constant material having a higher dielectric constant than silicon oxide. Accordingly, the gate dielectric film 120 including the first sub-dielectric film 122 and the second sub-dielectric film 124 may be formed.

The preliminary gate electrode 130 may be formed on the gate dielectric film 120. The preliminary gate electrode 130 may extend in the second direction X. Also, the preliminary gate electrode 130 may include a lower gate region R1 and an upper gate region R2. Accordingly, the first active patterns 110A and 110B and the second active patterns 210A and 210B may extend in the first direction Y and penetrate the preliminary gate electrode 130, respectively.

Figure 26:
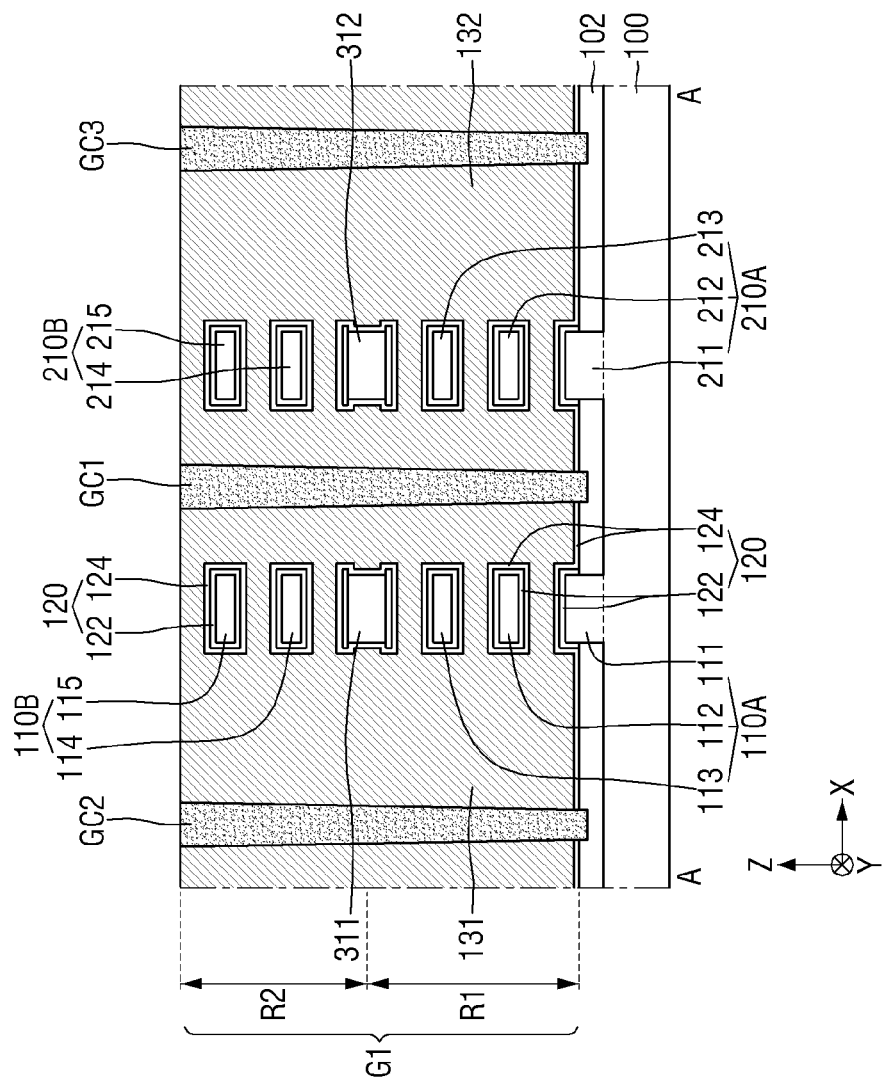

Referring to FIG. 26, cutting patterns GC1, GC2 and GC3 are formed.

The cutting patterns GC1, GC2 and GC3 may extend in the first direction Y to cut the preliminary gate electrode 130. Each of the cutting patterns GC1, GC2 and GC3 may include an insulating material, for example, at least one of silicon oxide, silicon nitride, silicon oxynitride, silicon oxycarbide, silicon boronitride, silicon boron carbonitride, silicon oxycarbonitride, and combinations thereof.

Figure 27:
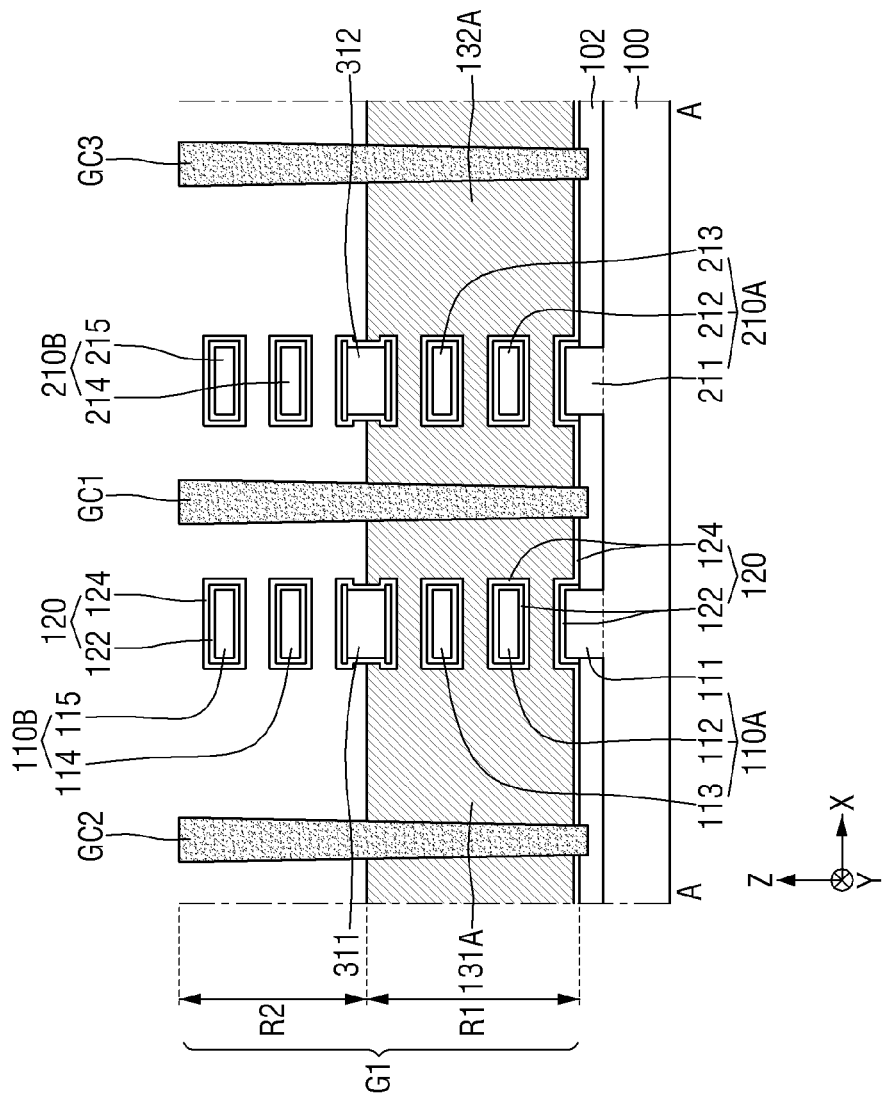

Referring to FIG. 27, the upper gate region R2 of the preliminary gate electrode 130 is removed.

For example, a recess process for the preliminary gate electrode 130 may be performed. Accordingly, a first lower gate electrode 131A intersecting the first lower active pattern 110A and a second lower gate electrode 132A intersecting the second lower active pattern 210A may be formed.

Figure 28:
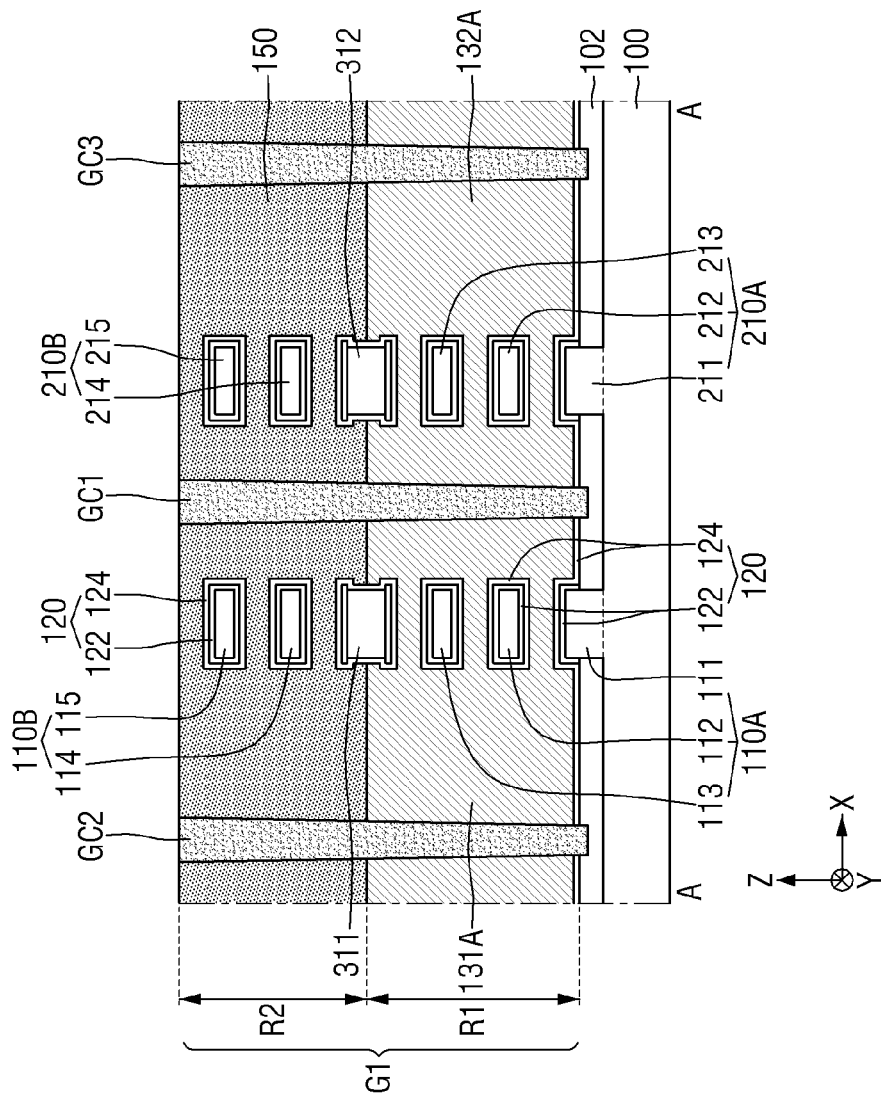

Referring to FIG. 28, a preliminary insulating pattern 150 is formed on the lower gate region R1.

The preliminary insulating pattern 150 may replace the region in which the upper gate region R2 of the preliminary gate electrode 130 is removed. For example, the preliminary insulating pattern 150 may extend in the second direction X on the lower gate region R1. Also, the preliminary insulating pattern 150 may be cut by the cutting patterns GC1, GC2, and GC3.

The preliminary insulating pattern 150 may include an insulating material, for example, at least one of silicon oxide, silicon nitride, silicon oxynitride, silicon oxycarbide, silicon boronitride, silicon boron carbonitride, silicon oxycarbonitride, and combinations thereof.

Figure 29:
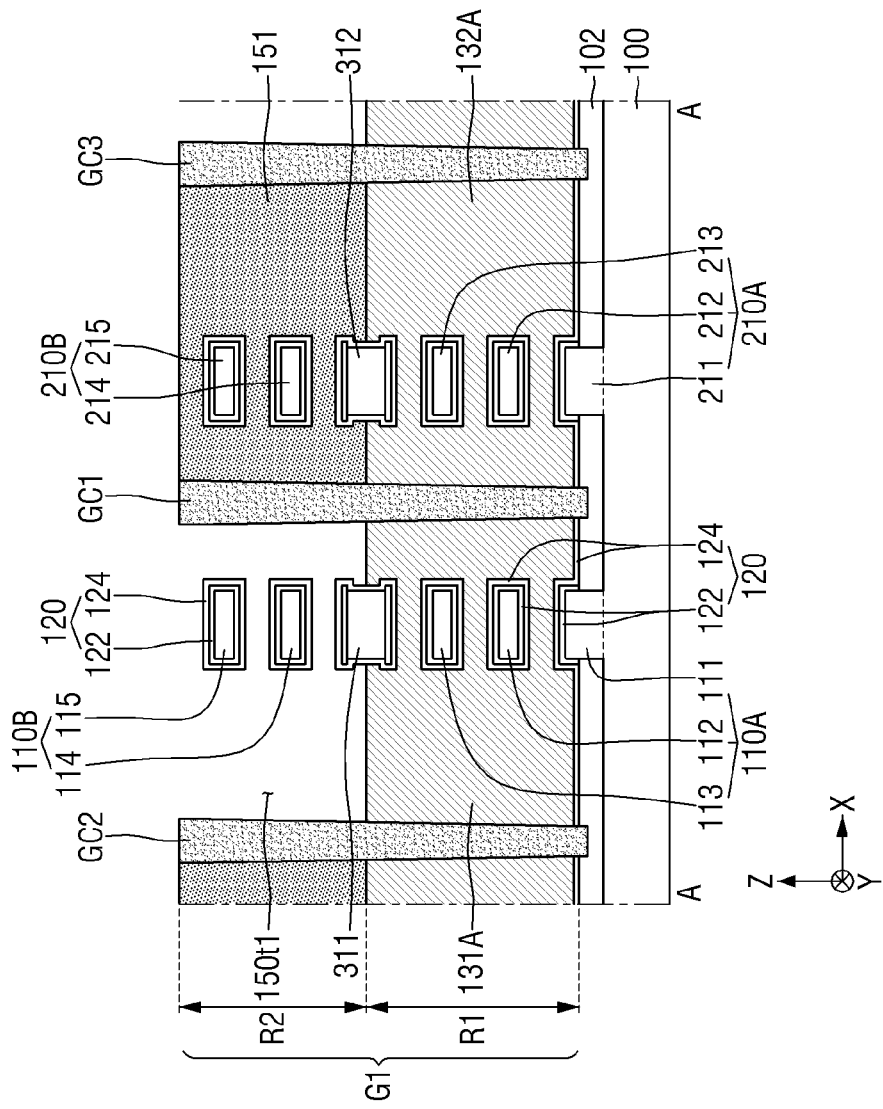

Referring to FIG. 29, a first trench 150t1 is formed inside the upper gate region R2.

The first trench 150t1 may expose the first lower gate electrode 131A. For example, the preliminary insulating pattern 150 on the first lower gate electrode 131A may be removed. Accordingly, the first insulating pattern 151 placed on the second lower gate electrode 132A may be formed.

Figure 30:
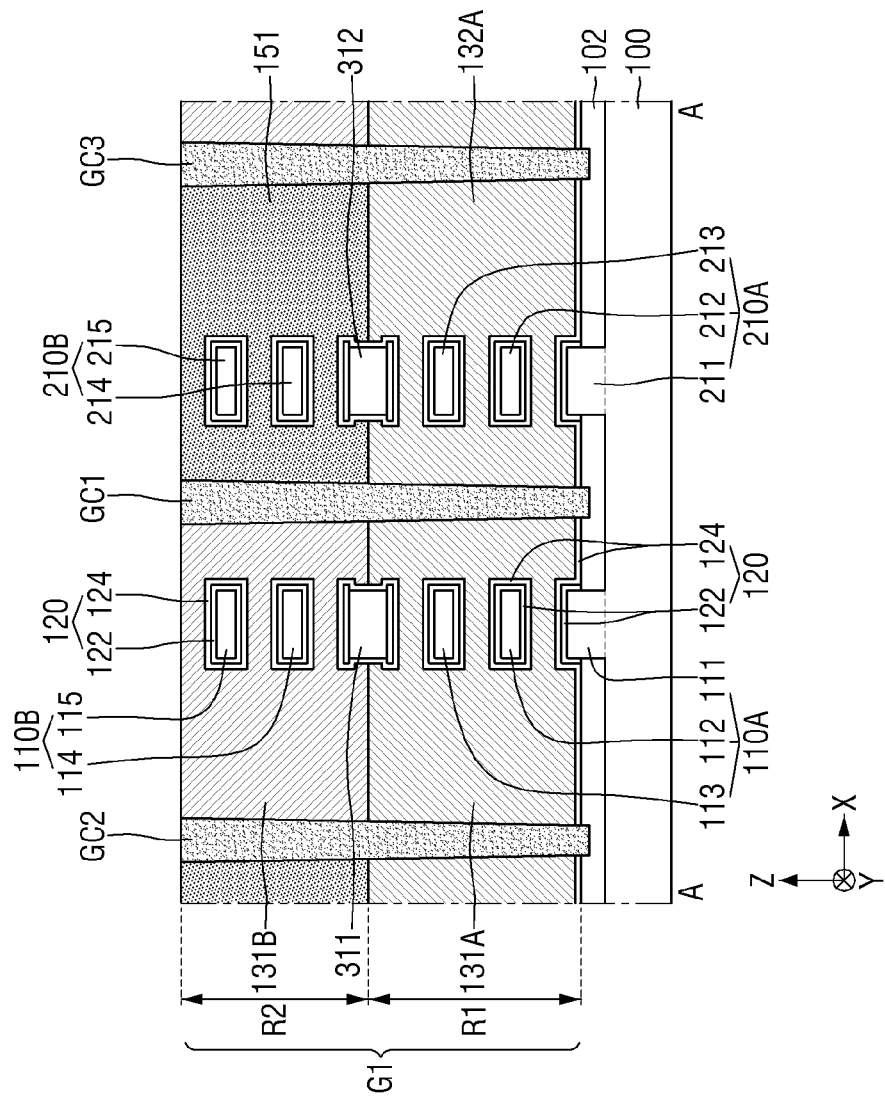

Referring to FIG. 30, a first upper gate electrode 131B is formed on the first lower gate electrode 131A.

The first upper gate electrode 131B may replace the region in which the preliminary insulating pattern 150 is removed. For example, the first upper gate electrode 131B may extend in the second direction X on the first lower gate electrode 131A. Also, the first upper gate electrode 131B may be connected to the first lower gate electrode 131A.

Next, referring to FIG. 3, a first overlap contact 190A and a first gate contact 192 are formed. Therefore, the semiconductor device described above using FIGS. 2 to 5 may be fabricated.

Figure 31:
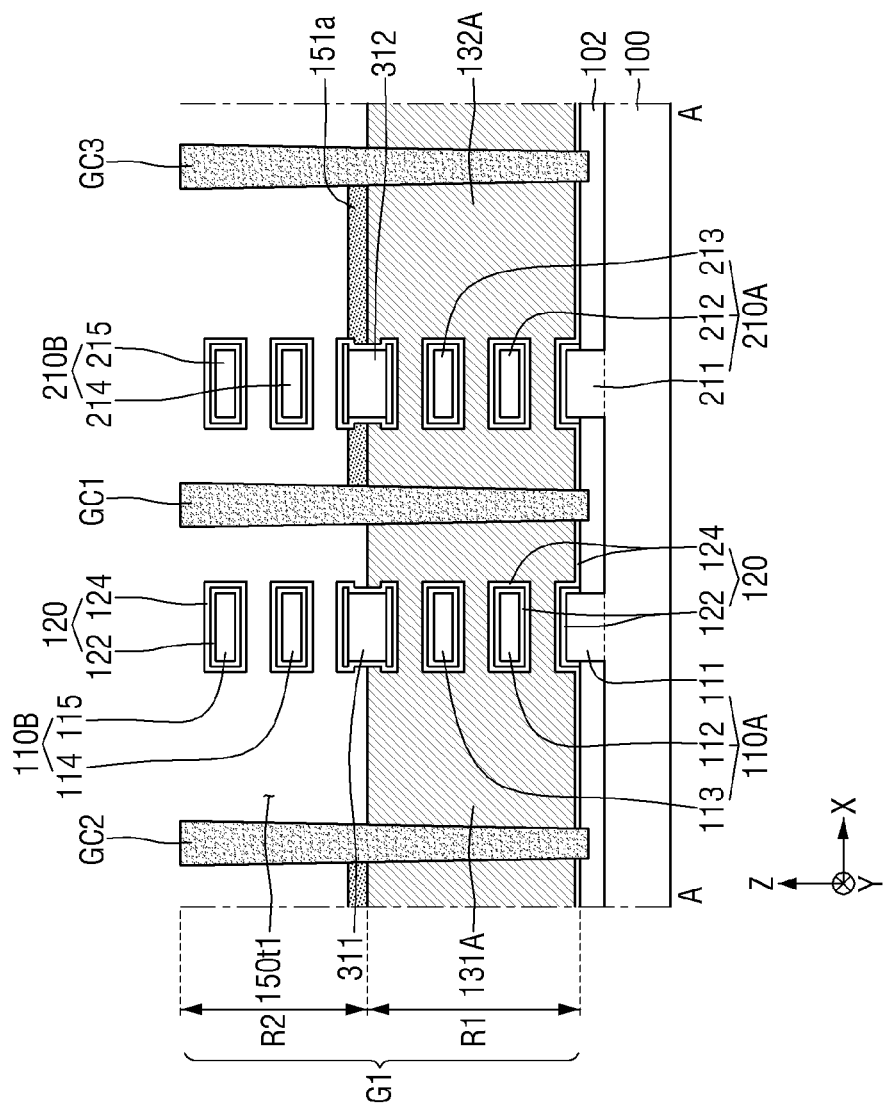
FIGS. 31 to 34 are intermediate step diagrams for explaining the method for fabricating a semiconductor memory device according to some embodiments.

FIGS. 31 to 34 are intermediate step diagrams for explaining the method for fabricating a semiconductor memory device according to some embodiments. For convenience of explanation and conciseness, repeated parts of contents explained using FIGS. 1 to 30 will be briefly explained or omitted. For reference, FIG. 31 is an intermediate step diagram for explaining the steps after FIG. 28.

Referring to FIG. 31, the first trench 150t1 is formed inside the upper gate region R2.

The first trench 150t1 may expose the first lower gate electrode 131A. For example, a recess process of the preliminary insulating pattern 150 may be performed. The preliminary insulating pattern 150 may be recessed to expose the first lower gate electrode 131A and cover the second lower gate electrode 132A. As a result, a horizontal insulating portion 151a placed on the second lower gate electrode 132A may be formed.

Figure 32:
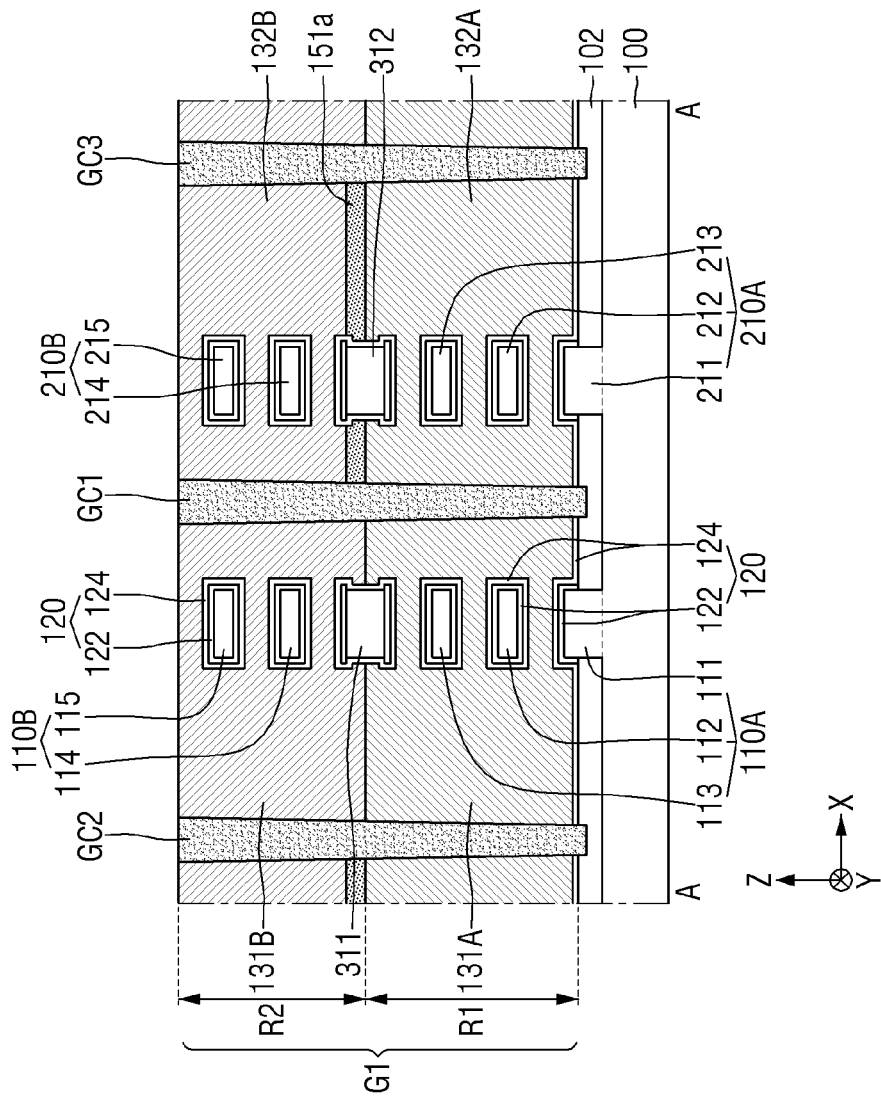

Referring to FIG. 32, a first upper gate electrode 131B is formed on the first lower gate electrode 131A, and a second upper gate electrode 132B is formed on the horizontal insulating portion 151a.

The first upper gate electrode 131B and the second upper gate electrode 132B may replace the region in which the preliminary insulating pattern 150 is removed. Therefore, the first upper gate electrode 131B and the first lower gate electrode 131A may be interconnected, and the second upper gate electrode 132B and the second lower gate electrode 132A may be electrically insulated by the horizontal insulating portion 151a.

Figure 33:
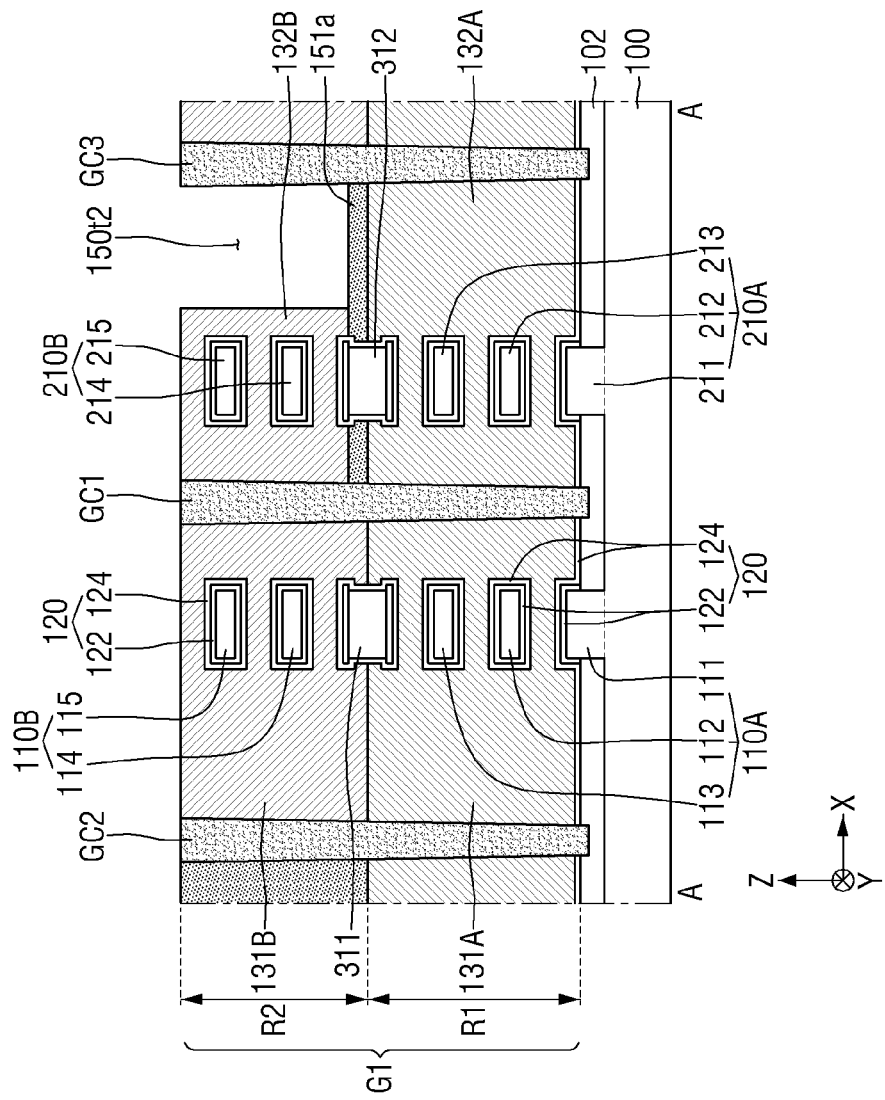

Referring to FIG. 33, a second trench 150t2 is formed inside the second upper gate electrode 132B.

For example, the second upper gate electrode 132B adjacent to the third cutting pattern GC3 may be removed. Accordingly, a second upper gate electrode 132B interposed between the first cutting pattern GC1 and the second trench 150t2 may be formed.

Although the horizontal insulating portion 151a is shown only as not being etched during the process of forming the second trench 150t2, this is merely an example. As another example, the horizontal insulating portion 151a may be etched during the process of forming the second trench 150t2 to expose the second lower gate electrode 132A.

Figure 34:
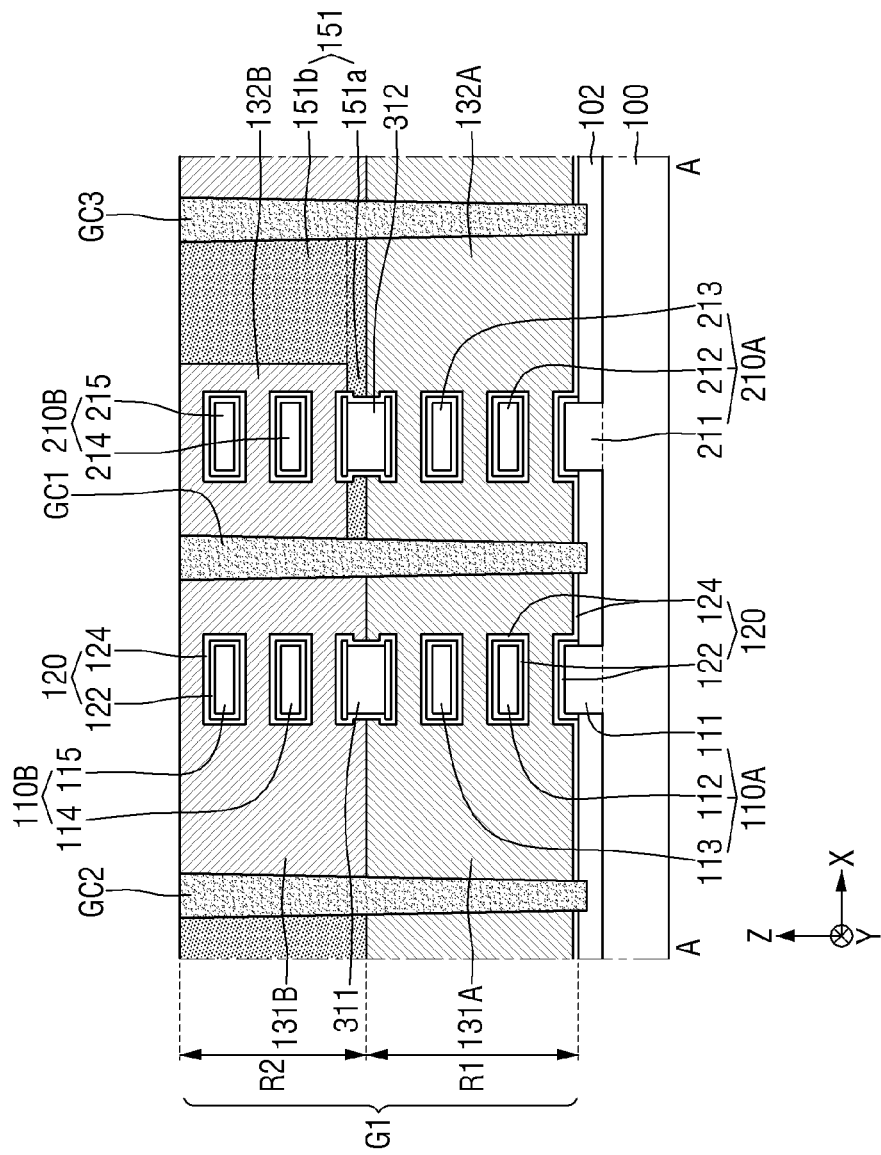

Referring to FIG. 34, a vertical insulating portion 151b that fills the second trench 150t2 is formed.

Accordingly, the first insulating pattern 151 including the horizontal insulating portion 151a and the vertical insulating portion 151b may be formed. The horizontal insulating portion 151a and the vertical insulating portion 151b may include the same insulating material, or may include different insulating materials.

Next, referring to FIG. 8, a first overlap contact 190A and a first gate contact 192 are formed. Therefore, the semiconductor device described above using FIGS. 7 and 8 may be fabricated.

Figure 35:
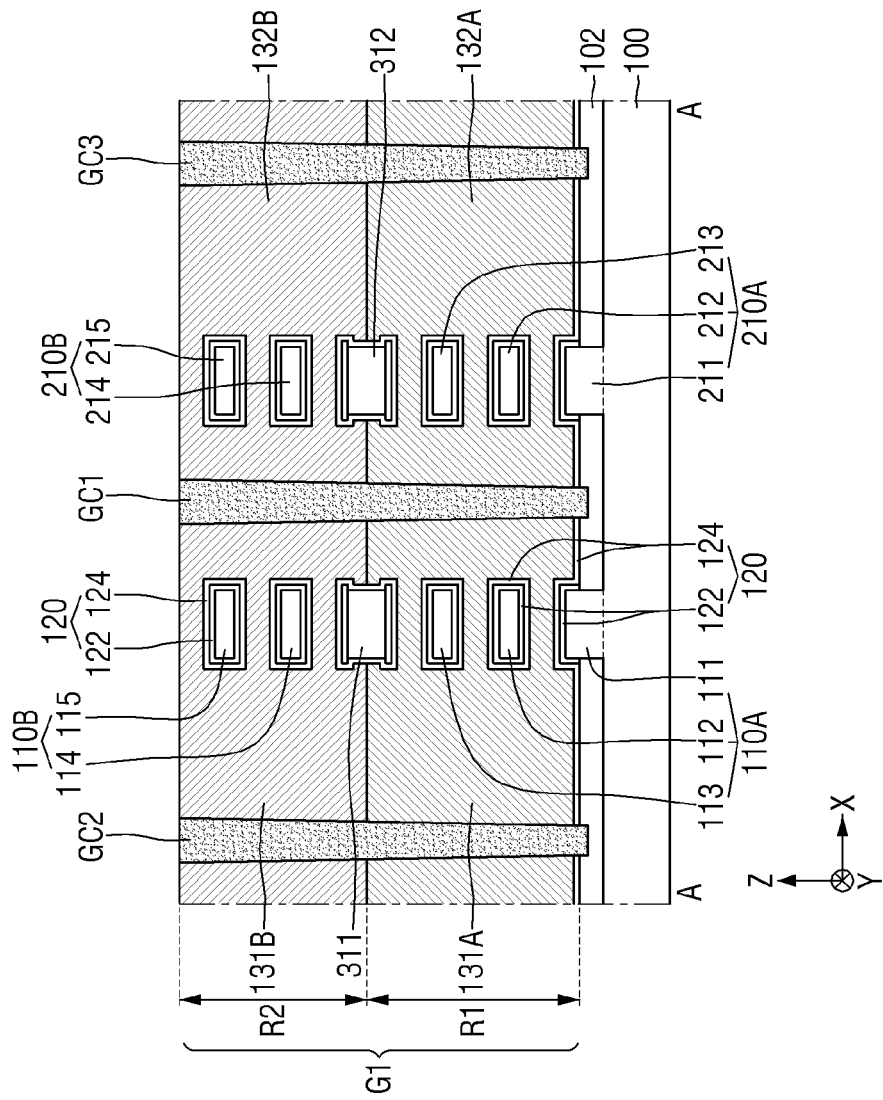
FIGS. 35 to 37 are intermediate step diagrams for explaining a method for fabricating a semiconductor memory device according to some embodiments.
Figure 36:
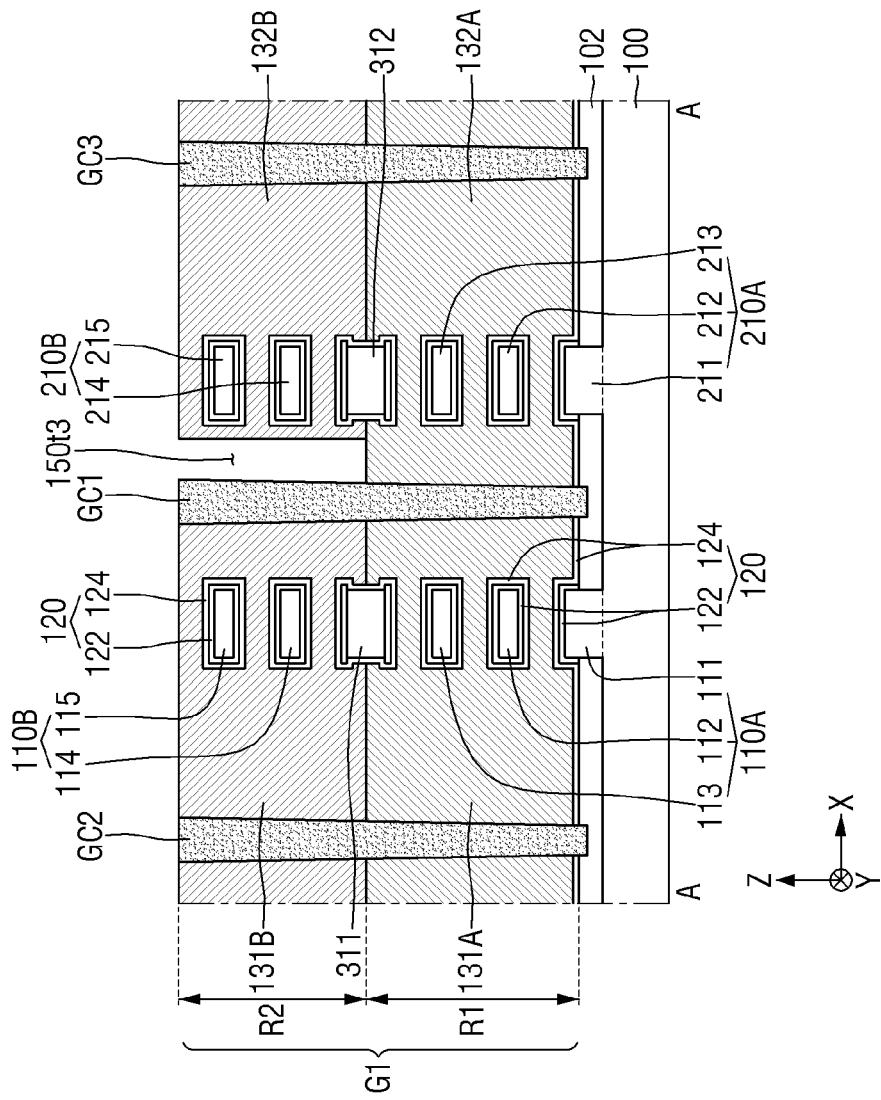
Figure 37:
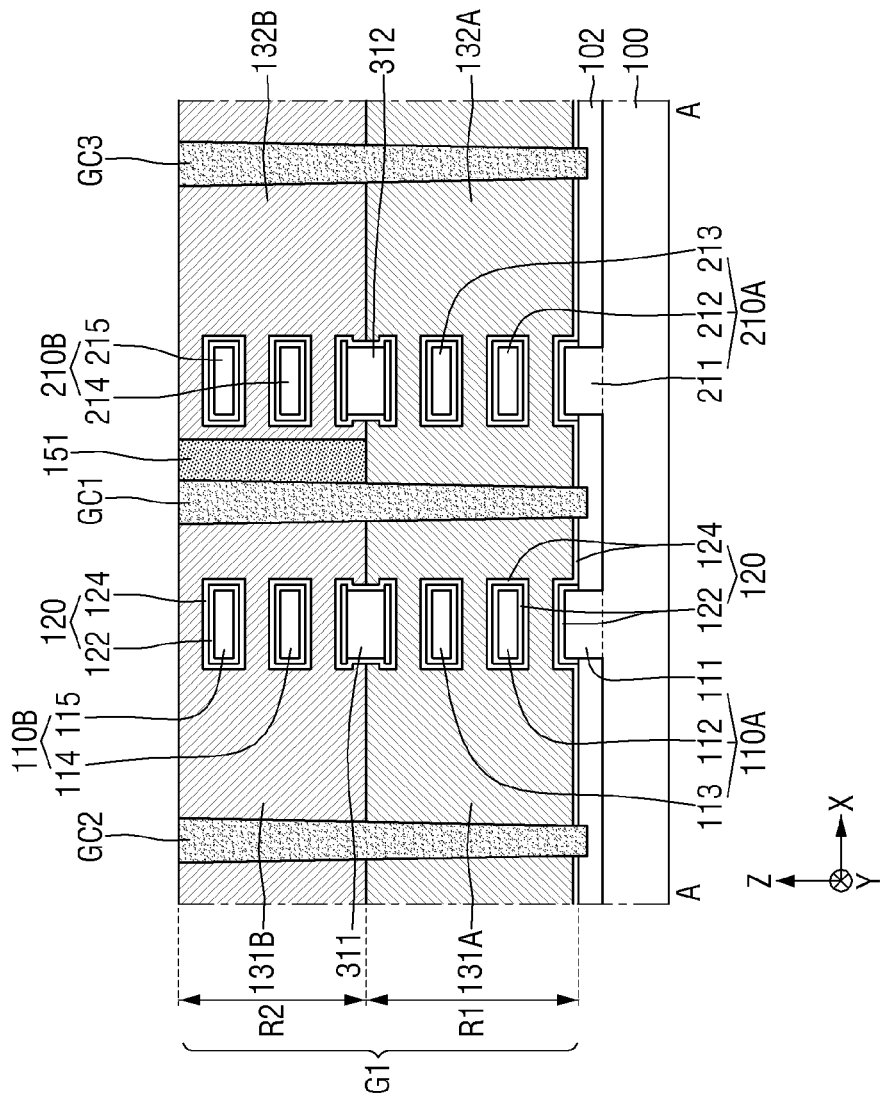

FIGS. 35 to 37 are intermediate step diagrams for explaining a method for fabricating a semiconductor memory device according to some embodiments. For convenience of explanation and conciseness, repeated parts of contents explained using FIGS. 1 to 30 will be briefly explained or omitted. For reference, FIG. 35 is an intermediate step diagram for explaining the steps after FIG. 27.

Referring to FIG. 35, a first upper gate electrode 131B and a second upper gate electrode 132B are formed on the lower gate region R1.

Accordingly, the first upper gate electrode 131B and the first lower gate electrode 131A may be interconnected, and the second upper gate electrode 132B and the second lower gate electrode 132A may be interconnected.

Referring to FIG. 36, a third trench 150t3 is formed inside the second upper gate electrode 132B.

For example, the second upper gate electrode 132B adjacent to the first cutting pattern GC1 may be removed. Therefore, the second upper gate electrode 132B interposed between the third cutting pattern GC3 and the third trench 150t3 may be formed.

Referring to FIG. 37, a first insulating pattern 151 that fills the third trench 150t3 is formed.

As a result, the first insulating pattern 151 interposed between the first cutting pattern GC1 and the second upper gate electrode 132B may be formed.

Next, referring to FIG. 10, a first overlap contact 190A and a first gate contact 192 are formed. Accordingly, the semiconductor device described above using FIGS. 9 and 10 may be fabricated.

While various embodiments have been particularly shown and described with reference to the drawings, it will be understood by those of ordinary skill in the art that various changes in form and details may be made therein without departing from the spirit and scope of the present disclosure as defined by the following claims. It is therefore desired that the various embodiments be considered in all respects as illustrative and not restrictive, reference being made to the appended claims rather than the foregoing description to indicate the scope of the present disclosure.

What is claimed is:

1. A semiconductor device comprising:
   a substrate;
   a lower active pattern which is spaced apart from the substrate and extends in a first direction;
   an upper active pattern on the lower active pattern, the upper active pattern being spaced apart from the lower active pattern and extending in the first direction;
   a gate structure on the substrate, the gate structure extending in a second direction intersecting the first direction; and
   a cutting pattern on the substrate, the cutting pattern extending in the first direction to cut the gate structure,
   wherein the gate structure includes:
      a lower gate electrode through which the lower active pattern penetrates;
      an upper gate electrode which is connected to the lower gate electrode and through which the upper active pattern penetrates; and
      an insulating pattern on one side of the cutting pattern, the insulating pattern being arranged with the upper gate electrode along the second direction.

2. The semiconductor device of claim 1, further comprising:
   a lower source/drain region on a side surface of the gate structure, the lower source/drain region being connected to the lower active pattern; and
   an upper source/drain region on the side surface of the gate structure, the upper source/drain region being connected to the upper active pattern.

3. The semiconductor device of claim 2,
   wherein the lower source/drain region and the upper source/drain region have different conductivity types from each other.

4. The semiconductor device of claim 2, further comprising:
   a lower source/drain contact which is connected to the lower source/drain region and not connected to the upper source/drain region;

an upper source/drain contact which is connected to the upper source/drain region and not connected to the lower source/drain region; and a shared source/drain contact which is connected to the lower source/drain region and the upper source/drain region.

5. The semiconductor device of claim 1, further comprising:

an overlap contact on the gate structure, the overlap contact being connected to the upper gate electrode, wherein at least a part of the overlap contact overlaps the cutting pattern and the insulating pattern.

6. The semiconductor device of claim 1, further comprising:

a gate contact on the gate structure, the gate contact penetrating the insulating pattern and being connected to the lower gate electrode.

7. The semiconductor device of claim 1, wherein an upper surface of the upper gate electrode and an upper surface of the insulating pattern are coplanar.

8. The semiconductor device of claim 1, wherein a lower surface of the upper gate electrode and a lower surface of the insulating pattern are coplanar.

9. A semiconductor device comprising:

a substrate;

a cutting pattern on the substrate, the cutting pattern extending in a first direction;

a first lower gate electrode which extends from a first side of the cutting pattern in a second direction intersecting the first direction;

a second lower gate electrode which extends in the second direction from a second side of the cutting pattern that is opposite to the first side, the second lower gate electrode being arranged with the first lower gate electrode along the second direction;

a first upper gate electrode on the first lower gate electrode, the first upper gate electrode extending in the second direction and being connected to the first lower gate electrode;

an insulating pattern on the second lower gate electrode, the insulating pattern being arranged with the first upper gate electrode along the second direction;

a first lower active pattern extending in the first direction and penetrating the first lower gate electrode;

a second lower active pattern extending in the first direction and penetrating the second lower gate electrode;

a first upper active pattern extending in the first direction and penetrating the first upper gate electrode;

an overlap contact connected to the first upper gate electrode; and a gate contact connected to the second lower gate electrode, wherein the insulating pattern electrically insulates the overlap contact and the gate contact.

10. The semiconductor device of claim 9, wherein at least a part of the overlap contact overlaps the cutting pattern and the insulating pattern, and the gate contact penetrates the insulating pattern and is connected to the second lower gate electrode.

11. The semiconductor device of claim 9, further comprising:

a second upper gate electrode on the second lower gate electrode, the second upper gate electrode extending in the second direction.

12. The semiconductor device of claim 11, wherein the second upper gate electrode is interposed between the cutting pattern and the insulating pattern, and the insulating pattern includes:

a horizontal insulating portion interposed between the second lower gate electrode and the second upper gate electrode; and a vertical insulating portion arranged with the second upper gate electrode along the second direction.

13. The semiconductor device of claim 12, wherein at least a part of the overlap contact overlaps the cutting pattern and the second upper gate electrode, and the gate contact penetrates the vertical insulating portion and is connected to the second lower gate electrode.

14. The semiconductor device of claim 11, wherein the insulating pattern is interposed between the cutting pattern and the second upper gate electrode, and the second upper gate electrode is connected to the second lower gate electrode.

15. The semiconductor device of claim 14, wherein at least a part of the overlap contact overlaps the cutting pattern and the insulating pattern, and the gate contact is connected to the second upper gate electrode.

16. A semiconductor device comprising:

a substrate;

a cutting pattern on the substrate, the cutting pattern extending in a first direction;

a first lower gate electrode which extends from a first side of the cutting pattern in a second direction intersecting the first direction;

a second lower gate electrode which extends from a second side of the cutting pattern opposite to the first side of the cutting pattern in the second direction, the second lower gate electrode being arranged with the first lower gate electrode along the second direction;

a first upper gate electrode on the first lower gate electrode, the first upper gate electrode extending in the second direction and being connected to the first lower gate electrode;

an insulating pattern on the second lower gate electrode, the insulating pattern being arranged with the first upper gate electrode along the second direction;

a third lower gate electrode which is spaced apart from the second lower gate electrode in the first direction and extends in the second direction;

a third upper gate electrode on the third lower gate electrode, the third upper gate electrode extending in the second direction and being connected to the third lower gate electrode;

a first lower active pattern extending in the first direction and penetrating the first lower gate electrode;

a first upper active pattern extending in the first direction and penetrating the first upper gate electrode;

a second lower active pattern extending in the first direction and penetrating the third lower gate electrode;

a second upper active pattern extending in the first direction and penetrating the third upper gate electrode;

a shared source/drain contact which connects a lower source/drain region of the second lower active pattern and an upper source/drain region of the second upper active pattern; and an overlap contact which connects the first upper gate electrode and the shared source/drain contact.

17. The semiconductor device of claim 16, wherein the overlap contact includes:

a first extension extending in the second direction and connected to the first upper gate electrode; and a second extension extending from the first extension in the first direction and connected to the shared source/drain contact.

18. The semiconductor device of claim 17, wherein the first extension of the overlap contact overlaps the cutting pattern and the insulating pattern.

19. The semiconductor device of claim 17, further comprising:

a second upper gate electrode on the second lower gate electrode, the second upper gate electrode extending in the second direction, wherein the first extension of the overlap contact overlaps the cutting pattern and the second upper gate electrode.

20. The semiconductor device of claim 16, further comprising:

a gate contact connected to the second lower gate electrode, wherein the insulating pattern electrically insulates the overlap contact and the gate contact.

* * * * *